(12) United States Patent
Yamazaki et al.

(10) Patent No.: US 7,768,405 B2
(45) Date of Patent: Aug. 3, 2010

(54) SEMICONDUCTOR DEVICE AND MANUFACTURING METHOD THEREOF

(75) Inventors: Shunpei Yamazaki, Setagaya (JP); Jun Koyama, Sagamihara (JP); Mai Akiba, Isehara (JP)

(73) Assignee: Semiconductor Energy Laboratory Co., Ltd, Atsugi-shi, Kanagawa-ken (JP)

( * ) Notice: Subject to any disclaimer, the term of this patent is extended or adjusted under 35 U.S.C. 154(b) by 530 days.

(21) Appl. No.: 11/007,257

(22) Filed: Dec. 9, 2004

(65) Prior Publication Data
US 2005/0130389 A1    Jun. 16, 2005

(30) Foreign Application Priority Data
Dec. 12, 2003  (JP) .............................. 2003-414848
Jan. 16, 2004  (JP) .............................. 2004-009529

(51) Int. Cl.
*G08B 13/14*    (2006.01)
(52) U.S. Cl. ............... 340/572.7; 340/568.1; 340/539.1
(58) Field of Classification Search ... 340/572.1–572.9, 340/568.1, 539.1; 235/492; 438/153, 155, 438/238, 280
See application file for complete search history.

(56) References Cited

U.S. PATENT DOCUMENTS

| | | | |
|---|---|---|---|
| 5,198,831 A | * | 3/1993 | Burrell et al. ............... 343/895 |
| 5,206,749 A | * | 4/1993 | Zavracky et al. ............... 349/45 |
| 5,347,154 A | | 9/1994 | Takahashi et al. |
| 5,397,713 A | * | 3/1995 | Hamamoto et al. ............ 438/97 |
| 5,403,700 A | * | 4/1995 | Heller et al. ................. 430/311 |
| 5,486,708 A | | 1/1996 | Takahashi et al. |
| 5,572,045 A | * | 11/1996 | Takahashi et al. .............. 257/59 |
| 5,618,739 A | | 4/1997 | Takahashi et al. |
| 5,643,804 A | | 7/1997 | Arai et al. |
| 5,643,826 A | | 7/1997 | Ohtani et al. |

(Continued)

FOREIGN PATENT DOCUMENTS

CN    1257598    6/2000

(Continued)

OTHER PUBLICATIONS

Display, Phoneyworld, 2004, http://www.phoneyworld.com.

(Continued)

*Primary Examiner*—Daniel Previl
(74) *Attorney, Agent, or Firm*—Eric J. Robinson; Robinson Intellectual Property Law Office, P.C.

(57) ABSTRACT

A semiconductor device typified by a wireless tag, which has improved mechanical strength, can be formed by a more simple process at a low cost and prevent radio waves from being shielded, and a manufacturing method of the semiconductor device. According to the invention, a wireless tag includes a thin film integrated circuit formed of an isolated TFT having a thin film semiconductor film. The wireless tag may be attached directly to an object, or attached to a flexible support such as plastic and paper before being attached to an object. The wireless tag of the invention may include an antenna as well as the thin film integrated circuit. The antenna allows to communicate signals between a reader/writer and the thin film integrated circuit, and to supply a power source voltage from the reader/writer to the thin film integrated circuit.

27 Claims, 13 Drawing Sheets

U.S. PATENT DOCUMENTS

| | | |
|---|---|---|
| 5,703,755 A | 12/1997 | Flesher et al. |
| 5,728,591 A | 3/1998 | Takahashi et al. |
| 5,773,327 A | 6/1998 | Yamazaki et al. |
| 5,821,138 A | 10/1998 | Yamazaki et al. |
| 5,985,741 A | 11/1999 | Yamazaki et al. |
| 6,004,831 A | 12/1999 | Yamazaki et al. |
| 6,127,199 A | 10/2000 | Inoue et al. |
| 6,133,835 A | 10/2000 | DeLeeuw et al. |
| 6,232,621 B1 | 5/2001 | Yamazaki et al. |
| 6,312,795 B1 | 11/2001 | Yamamoto |
| 6,313,481 B1 | 11/2001 | Ohtani et al. |
| 6,331,722 B1 | 12/2001 | Yamazaki et al. |
| 6,372,608 B1 | 4/2002 | Shimoda et al. |
| 6,407,669 B1 | 6/2002 | Brown et al. |
| 6,413,842 B2 | 7/2002 | Yamazaki et al. |
| 6,436,520 B1 | 8/2002 | Yamamoto |
| 6,468,835 B1 | 10/2002 | Blanc et al. |
| 6,478,229 B1 * | 11/2002 | Epstein ............... 235/492 |
| 6,509,217 B1 * | 1/2003 | Reddy ................ 438/153 |
| 6,521,489 B2 | 2/2003 | Duthaler |
| 6,566,235 B2 | 5/2003 | Nishida et al. |
| 6,596,571 B2 | 7/2003 | Arao et al. |
| 6,617,521 B1 * | 9/2003 | Saito et al. .......... 174/260 |
| 6,621,099 B2 | 9/2003 | Ong et al. |
| 6,645,830 B2 | 11/2003 | Shimoda et al. |
| 6,646,711 B2 | 11/2003 | Sugano |
| 6,703,267 B2 | 3/2004 | Tanabe et al. |
| 6,715,871 B2 * | 4/2004 | Hashimoto et al. ......... 347/102 |
| 6,720,577 B2 | 4/2004 | Arao et al. |
| 6,765,270 B2 | 7/2004 | Chae |
| 6,770,904 B2 | 8/2004 | Ong et al. |
| 6,774,470 B2 * | 8/2004 | Yagi et al. ............. 257/679 |
| 6,777,529 B2 | 8/2004 | Ong et al. |
| 6,814,832 B2 | 11/2004 | Utsunomiya |
| 6,821,348 B2 | 11/2004 | Baude et al. |
| 6,878,643 B2 | 4/2005 | Krulevitch et al. |
| 6,885,032 B2 | 4/2005 | Forbes et al. |
| 6,900,861 B2 | 5/2005 | Yasui |
| 6,921,917 B2 | 7/2005 | Choi et al. |
| 6,943,437 B2 | 9/2005 | Blanc et al. |
| 6,946,361 B2 | 9/2005 | Takayama et al. |
| 6,979,840 B1 | 12/2005 | Yamazaki et al. |
| 6,994,414 B2 * | 2/2006 | Hashimoto et al. ............ 347/19 |
| 7,005,671 B2 | 2/2006 | Yamazaki et al. |
| 7,036,741 B2 | 5/2006 | Usami et al. |
| 7,042,052 B2 | 5/2006 | Bhattacharyya |
| 7,060,153 B2 | 6/2006 | Yamazaki et al. |
| 7,067,843 B2 | 6/2006 | Carcia et al. |
| 7,088,145 B2 | 8/2006 | Baude et al. |
| 7,180,093 B2 | 2/2007 | Takayama et al. |
| 7,202,495 B2 | 4/2007 | Unno |
| 7,285,476 B2 | 10/2007 | Shimoda et al. |
| 7,332,381 B2 | 2/2008 | Maruyama et al. |
| 7,335,573 B2 | 2/2008 | Takayama et al. |
| 7,482,620 B2 | 1/2009 | Kugler et al. |
| 2001/0045559 A1 | 11/2001 | Yamazaki et al. |
| 2002/0094639 A1 | 7/2002 | Reddy |
| 2003/0024635 A1 * | 2/2003 | Utsunomiya ............. 156/272.2 |
| 2003/0032210 A1 | 2/2003 | Takayama et al. |
| 2003/0083203 A1 | 5/2003 | Hashimoto et al. |
| 2003/0134488 A1 | 7/2003 | Yamazaki et al. |
| 2004/0128246 A1 | 7/2004 | Takayama et al. |
| 2004/0129450 A1 | 7/2004 | Yamazaki et al. |
| 2004/0164302 A1 | 8/2004 | Arai et al. |
| 2004/0245519 A1 * | 12/2004 | Van De Walle et al. ....... 257/40 |
| 2005/0051870 A1 | 3/2005 | Yamazaki et al. |
| 2005/0134463 A1 | 6/2005 | Yamazaki |
| 2006/0060852 A1 | 3/2006 | Yamazaki et al. |
| 2007/0159335 A1 | 7/2007 | Arai et al. |
| 2008/0049437 A1 | 2/2008 | Takayama et al. |

FOREIGN PATENT DOCUMENTS

| | | |
|---|---|---|
| CN | 1275840 | 12/2000 |
| CN | 1430192 | 7/2003 |
| EP | 0 486 318 | 5/1992 |
| EP | 0 858 110 | 8/1998 |
| EP | 1 081 721 | 3/2001 |
| JP | 07-130652 | 5/1995 |
| JP | 2000-299440 | 10/2000 |
| WO | WO 99/30432 * | 6/1999 |
| WO | WO 2005/057658 | 6/2005 |

OTHER PUBLICATIONS

"Sense of Crisis" is a Trigger. Ignited Evolution of a Sesame-Grain Sized Chip Technology development is entering into the second phase, Nikkei Electronics, No. 835, pp. 67-76, Nov. 18, 2002.

Office Action (Application No. 200410100264.0) dated Mar. 14, 2008.

* cited by examiner

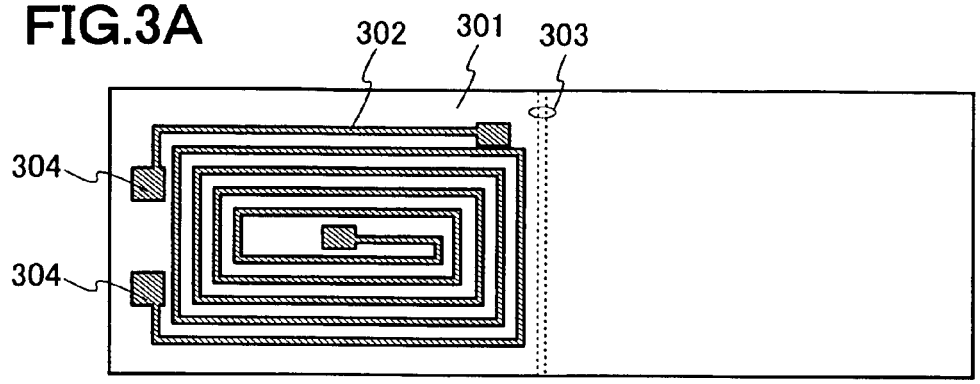
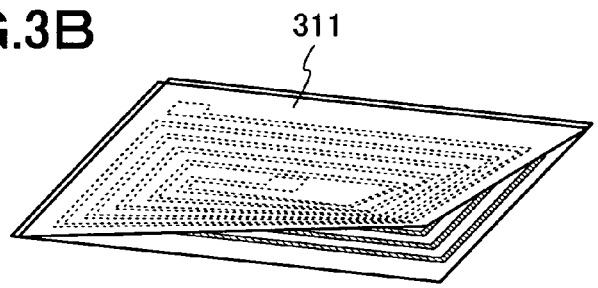
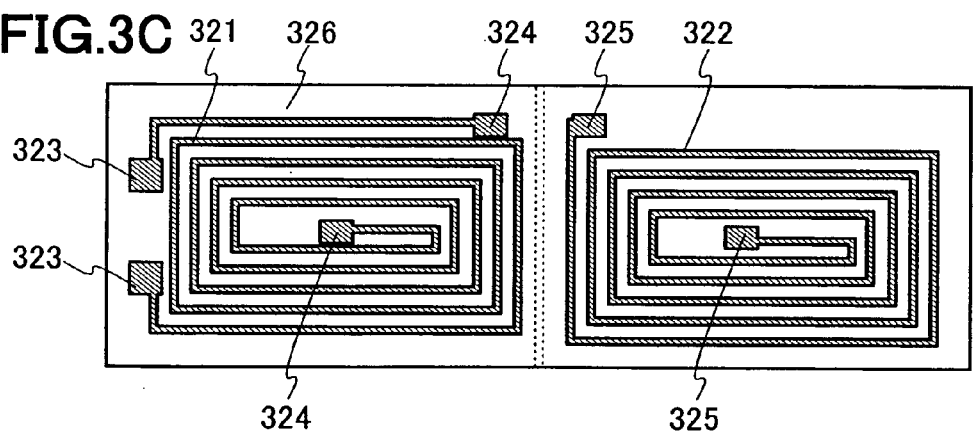
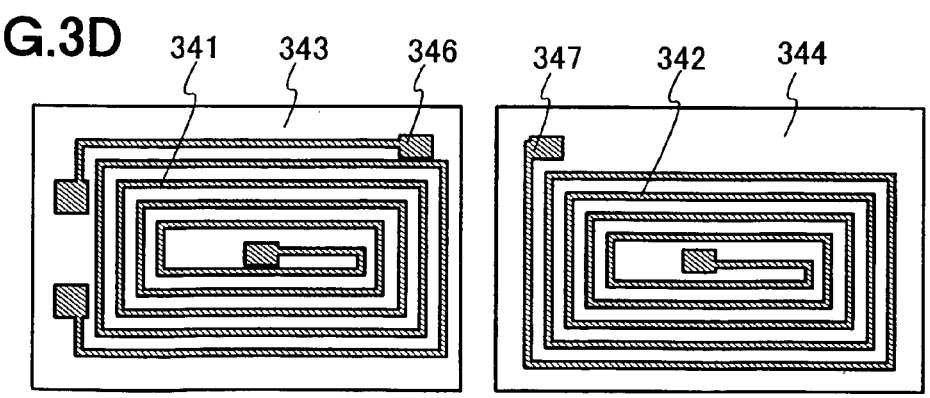

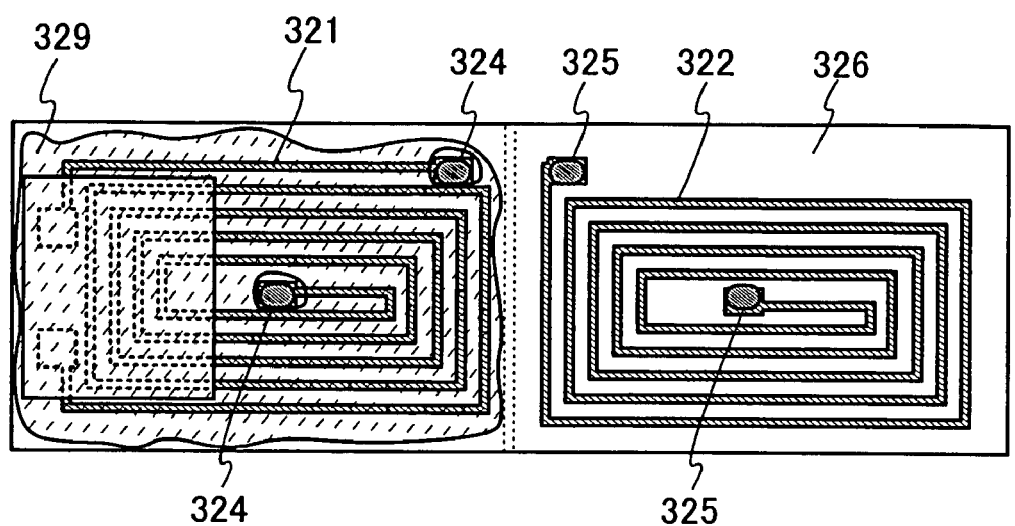
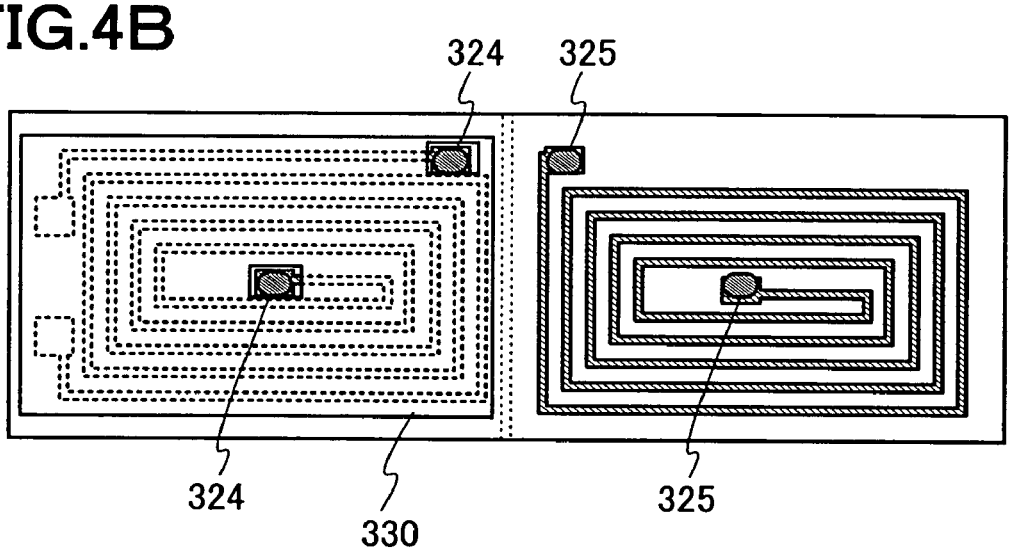

601 602
607 606 605 604 603

613 611 612

903  902  901

903  902

904

SEMICONDUCTOR DEVICE AND MANUFACTURING METHOD THEREOF

BACKGROUND OF THE INVENTION

1. Field of the Invention

The present invention relates to a semiconductor device capable of communicating wirelessly and a manufacturing method of the semiconductor device.

2. Description of the Related Art

A semiconductor device typified by a wireless tag capable of wirelessly communicating identification data or the like has been put into practical use in various fields, and the market thereof is likely to further increase as a new type of communication information terminal. The wireless tag is also called an RFID (Radio Frequency Identification) tag or an IC tag. The wireless tag in practical use usually has an antenna and an IC chip formed by using a semiconductor substrate.

An AC signal received by an antenna is rectified by a rectifier element such as a diode in a wireless tag, and then sent to the subsequent stages. In general, a transistor is used as the diode for rectification. A signal from the wireless tag can be read from the change in the impedance of the antenna caused by controlling a voltage applied to the antenna in the wireless tag. A transistor is also used as a switching element for controlling a voltage applied to the antenna.

In the case of such a transistor used as a diode or a switching element being formed by using a semiconductor substrate, there is a problem in that a large amount of current flows between a P-type base region and a drain region of the transistor depending on the polarity of an AC signal. The mechanism thereof is specifically described with reference to FIG. 12.

FIG. 12 shows a structure of a transistor formed on a single crystalline substrate. A transistor 7002 is formed in a P-type base region 7001 of a semiconductor substrate and includes N-type regions 7003 and 7004 each of which functions as a source region or a drain region. It is assumed that the P-type base region 7001 of the semiconductor substrate is connected to a ground potential and the N-type region 7003 is electrically connected to an antenna 7005. In that case, the N-type region 7003 and the P-type base region 7001 form a rectifying contact, thereby a parasitic diode 7006 is formed.

Accordingly, in the case of a potential supplied from the antenna 7005 to the N-type region 7003 being higher than the ground potential, a current does not flow easily from the N-type region 7003 to the P-type base region 7001. Meanwhile, in the case of a potential supplied from the antenna 7005 to the N-type region 7003 being lower than the ground potential, a current flows easily from the P-type base region 7001 to the N-type region 7003, which may lead to the degradation or even destruction of the transistor 7002.

In order to solve the aforementioned problem, Patent Document 1 discloses a structure in which a guard band applied with a bias through high resistance is provided at the periphery of a MOSFET.

[Patent Document 1] Japanese Patent Laid-Open No. 2000-299440

SUMMARY OF THE INVENTION

In the case of Patent Document 1, however, a guard band prevents high integration, and an increase in chip size is inevitable. Since the cost per area of a semiconductor substrate is higher than that of a glass substrate, the increase in chip size leads to an increase in cost per chip.

In addition, the wireless tag may be attached to a flexible material such as paper and plastic depending on the application, though the semiconductor substrate has a lower mechanical strength as compared with the aforementioned materials. Reduction in the area of the wireless tag itself allows the mechanical strength to increase to some extent. However, in that case, it is difficult to maintain the circuit scale and antenna gain. Particularly when the antenna gain is reduced, the communication distance is reduced and the application of the wireless tag is undesirably limited. Therefore, in view of the circuit scale of an IC chip and the antenna gain, the area of the wireless tag cannot be reduced randomly, leading to limit to the improvement of mechanical strength.

Further in the case of an IC chip formed by using a semiconductor substrate, the semiconductor substrate functions as a conductor to shield radio waves. Thus, there is a problem in that signals are easily attenuated depending on the direction of transmitted radio waves.

In view of the foregoing problems, the invention provides a semiconductor device typified by a wireless tag, which has improved mechanical strength, can be formed by a more simple process at a low cost and prevent radio waves from being shielded. The invention further provides a manufacturing method of the semiconductor device.

According to the invention, a device using an integrated circuit (hereinafter referred to as a thin film integrated circuit) formed of isolated TFTs (thin film transistors) each having a semiconductor thin film is referred to as a semiconductor device. Such a semiconductor device is used for a wireless tag (also called a wireless chip). The wireless tag may be attached directly to an object or may be attached onto a flexible support such as plastic and paper before being attached to the object. The wireless tag according to the invention can include an antenna as well as a thin film integrated circuit. The antenna allows to communicate signals between a reader/writer and a thin film integrated circuit, and to supply a power source voltage from the reader/writer to the thin film integrated circuit.

The antenna may be formed integrally with the thin film integrated circuit to be attached to an object or a flexible support. Alternatively, the antenna may be formed separately from the thin film integrated circuit to be attached to an object or a flexible support with the thin film integrated circuit. Instead, the antenna may be formed onto an object or a flexible support in advance, and the thin film integrated circuit may be attached to the object or the flexible support so as to be electrically connected to the antenna.

The thin film integrated circuit can be attached by various methods: a method in which a thin film integrated circuit is formed over a high heat resistant substrate with a metal oxide film interposed therebetween, and the metal oxide film is weakened by crystallization, thereby the thin film integrated circuit is peeled off to be attached; a method in which a thin film integrated circuit is formed over a high heat resistant substrate with an amorphous silicon film containing hydrogen interposed therebetween, and the amorphous silicon film is removed by laser irradiation or etching, thereby the thin film integrated circuit is peeled off from the substrate to be attached; a method in which a thin film integrated circuit is formed on a high heat resistant substrate, and the substrate is removed mechanically or by etching with the use of solution or gas, thereby the thin film integrated circuit is peeled off from the substrate to be attached; and the like.

The wireless tag of the invention may include a substrate that is removed when peeling off a thin film integrated circuit.

In addition, thin film integrated circuits formed separately may be attached and stacked to increase the circuit scale and the memory capacity. A thin film integrated circuit is drastically reduced in thickness as compared with an IC chip formed by using a semiconductor substrate. Therefore, the mechanical strength of the wireless tag can be maintained to some extent even when a plurality of thin film integrated circuits are stacked. The stacked thin film integrated circuits can be connected to each other by any known method such as flip chip technology, TAB (Tape Automated Bonding), and wire bonding.

Since the wireless tag of the invention uses a thin film integrated circuit formed of an isolated TFT, a parasitic diode is not easily formed between a substrate and the TFT, which differs from a transistor formed on a semiconductor substrate. Accordingly, a large amount of current does not flow into a drain region depending on the potential of an AC signal supplied to a source region or the drain region, which prevents the degradation or destruction.

By attaching the wireless tag directly to an object or onto a flexible support, the form of the wireless tag can be modified depending on the form of the object, resulting in increased versatility.

The wireless tag of the invention can have improved mechanical strength while not making the area thereof smaller than that of a conventional wireless tag using a semiconductor substrate. As a result, it becomes easy to ensure the antenna gain, increase the communication distance, and increase the versatility of the wireless tag.

In general, a wireless tag uses radio waves with a frequency of 13.56 MHz or 2.45 GHz. Therefore, in order to be widely used, a wireless tag is required to be formed so as to detect radio waves with these frequencies.

The wireless tag of the invention has the advantage in that radio waves are less shielded in a thin film integrated circuit as compared with in an IC chip formed by using a semiconductor substrate, thereby signal attenuation due to shielded radio waves can be prevented. Accordingly, the diameter of an antenna can be reduced as compared with in the case of an IC chip.

Without requiring a semiconductor substrate, the cost of the wireless tag can be drastically reduced. For example, the case of using a silicon substrate with a diameter of 12 inches is compared with the case of using a glass substrate with a size of 730×920 mm$^2$. The silicon substrate has an area of about 73000 mm$^2$ whereas the glass substrate has an area of about 672000 mm$^2$, that is, the glass substrate is about 9.2 times as large as the silicon substrate. On the glass substrate with an area of about 672000 mm$^2$, about 672000 wireless tags each having an area of 1 mm square can be formed when taking no account of margin for cutting the substrate, which is about 9.2 times as many as the wireless tags formed on the silicon substrate. In the case of using the glass substrate with a size of 730×920 mm$^2$, which requires fewer manufacturing steps, the amount of capital investment in mass production of wireless tags can be reduced to one-third of that in the case of using the silicon substrate with a diameter of 12 inches. Further, according to the invention, after a thin film integrated circuit is peeled off from a glass substrate, the glass substrate can be reused. Therefore, the cost in the case of using the glass substrate can be significantly reduced as compared with in the case of using the silicon substrate, even taking into account the cost of repairing a broken glass substrate or cleaning a surface of the glass substrate. The invention also relates to a wireless tag in which a thin film integrated circuit formed on a substrate is not peeled off yet. In the case of shipping such a wireless tag before being peeled off, the cost of the glass substrate used as a material influences the cost of the wireless tag largely. However, the glass substrate with a size of 730×920 mm$^2$ costs about half as much as the silicon substrate with a diameter of 12 inches.

As is evident from the foregoing, a wireless tag using a glass substrate with a size of 730×920 mm$^2$ costs only about one-thirtieth as much as a wireless tag using a silicon substrate with a diameter of 12 inches. Since the wireless tag is expected to be used as the disposable one, the wireless tag of the invention that can cost much less is quite effective for such application.

BRIEF DESCRIPTION OF THE DRAWINGS

FIGS. 3A to 3D are diagrams showing configurations of an antenna used in the wireless tag of the invention.

FIGS. 4A and 4B are diagrams showing configurations of the wireless tag of the invention.

DETAILED DESCRIPTION OF THE INVENTION

The wireless tag of the invention includes a thin film integrated circuit that operates with an AC signal supplied from an antenna. The wireless tag of the invention may also include an antenna as well as the thin film integrated circuit. In that case, the antenna may be formed integrally with or separately from the thin film integrated circuit. The thin film integrated circuit may be attached directly to an object or may be attached to a flexible support before being attached to the object. A configuration of the wireless tag of the invention is described with reference to FIGS. 1A to 1C.

Figure 1A:
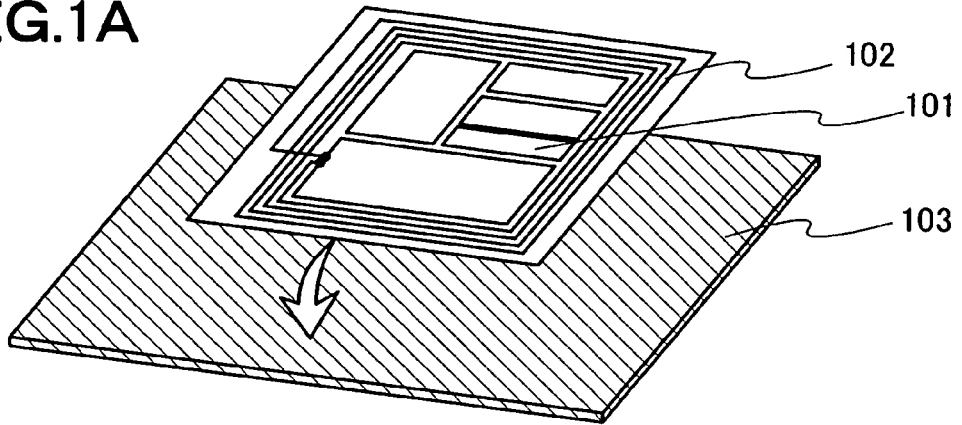
FIGS. 1A to 1C are diagrams showing configurations of the wireless tag of the invention.

FIG. 1A shows a configuration in which a thin film integrated circuit 101 and an antenna 102 are integrally formed to be attached directly to an object 103. In the case of FIG. 1A, the manufacturing step of the thin film integrated circuit 101 and the antenna 102 can be simplified and the attachment thereof can be carried out at a time.

Although the thin film integrated circuit 101 and the antenna 102 are attached directly to the object 103 in FIG. 1A, they may be attached to a flexible support before being attached to the object 103. In the latter case, the attachment of the wireless tag to the object can be more simplified, resulting in increased versatility of the wireless tag.

Figure 1B:
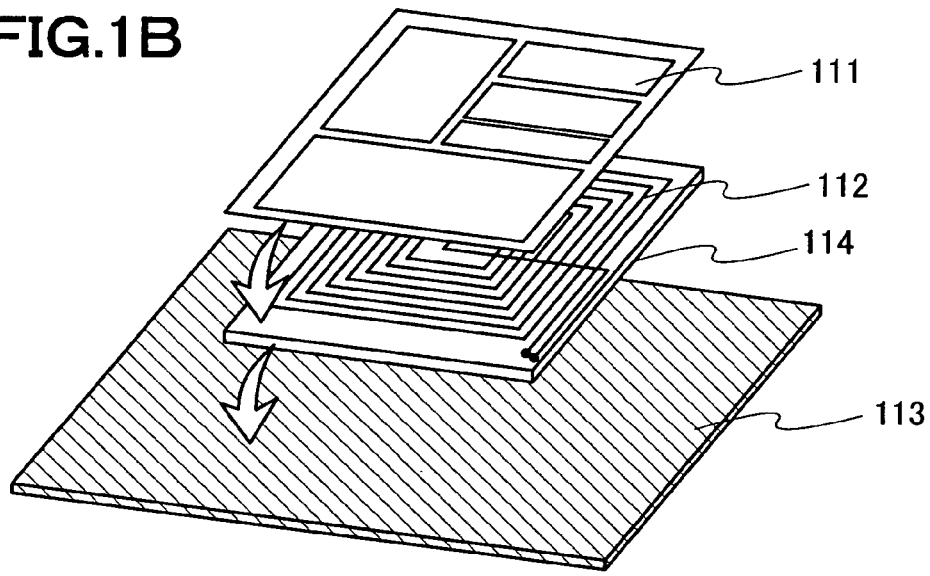

FIG. 1B shows a configuration in which a thin film integrated circuit 111 and an antenna 112 are formed separately and attached to an object 113. In FIG. 1B, the antenna 112 is formed on a flexible support 114 and then attached to the object 113. The antenna 112 may be separately formed in advance and then attached to the flexible support 114, or may be formed directly on the flexible support 114 by a printing method such as screen printing and offset printing, droplet ejection, vapor deposition, photolithography or the like.

The droplet ejection means a method of forming a predetermined pattern by ejecting from pores a droplet containing a predetermined composition, and includes ink-jet printing and the like.

Although the thin film integrated circuit 111 is attached so as to be stacked on the antenna 112 in FIG. 1B, the invention is not limited to this configuration. The thin film integrated circuit 111 may be attached so as to be adjacent to the antenna 112 on the object 113. In the latter case, electrical connection between the thin film integrated circuit 111 and the antenna 112 may be formed by using a wiring that is formed separately after the attachment or by using a wiring that is formed on the object 113 in advance.

In addition, the order of stacking the thin film integrated circuit 111 and the antenna 112 is not limited to the one shown in FIG. 1B. The antenna 112 is not necessarily formed between the thin film integrated circuit 111 and the object 113, and the thin film integrated circuit 111 may be formed between the antenna 112 and the object 113.

Furthermore, although only the antenna 112 is attached to the flexible support 114 in FIG. 1B, the invention is not limited to this configuration. For example, the thin film integrated circuit 111 may be attached to a support, and then attached to the object 113 with the antenna 112.

Also in FIG. 1B, the antenna 112 and the thin film integrated circuit 111 that are formed separately may be attached to the same support and then attached to the object 113. In that case, the attachment of the wireless tag to the object can be more simplified, resulting in increased versatility of the wireless tag.

Figure 1C:
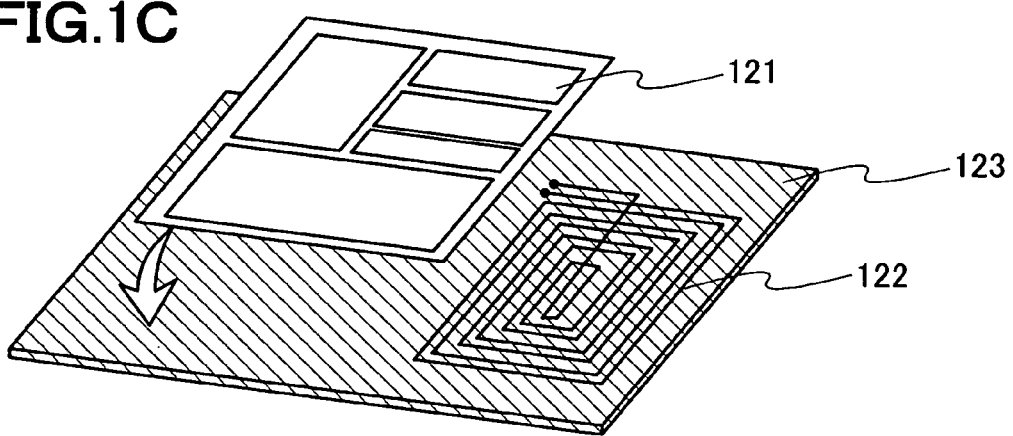

FIG. 1C shows a configuration in which an antenna 122 is formed on an object 123 in advance. The antenna 122 may be formed separately and attached onto the object 123, or may be formed on the object 123 by direct printing, droplet ejection, vapor deposition, photolithography and the like. Then, a thin film integrated circuit 121 is attached onto the object 123 on which the antenna 122 is formed. Note that the thin film integrated circuit 121 may be attached so as to be adjacent to the antenna 122 or overlapped with the antenna 122 to have a stacked structure.

Alternatively, the thin film integrated circuit 121 may be formed on a support that is prepared separately, and then attached onto the object 123. In that case, the attachment of the wireless tag to the object can be more simplified, resulting in increased versatility of the wireless tag.

In the case of a flexible support being used, a wireless tag can be formed so that an antenna or a thin film integrated circuit is surrounded by or put in the flexible support. A configuration of a wireless tag formed by using a folded support is described with reference to FIGS. 2A to 2E.

Figure 2A:
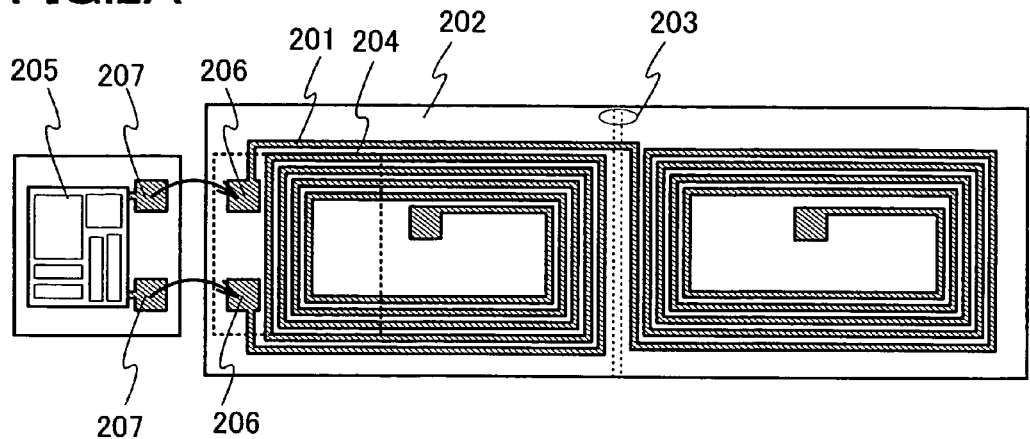
FIGS. 2A to 2E are diagrams showing configurations of the wireless tag of the invention, which is formed by using a folded support.

FIG. 2A is a top plan view of a flexible support 202 on which an antenna 201 is formed. A dashed line 203 corresponds to a fold line. The antenna 201 may be formed separately and then attached onto the support 202, or may be formed directly on the flexible support 202 by photolithography, printing, vapor deposition, droplet ejection and the like. A thin film integrated circuit 205 is attached to a region surrounded by a dashed line 204 so as not to be overlapped with the fold line 203. As the result of the attachment, a connecting terminal 206 of the antenna 201 can be electrically connected to a connecting terminal 207 of the thin film integrated circuit 205.

Figure 2B:
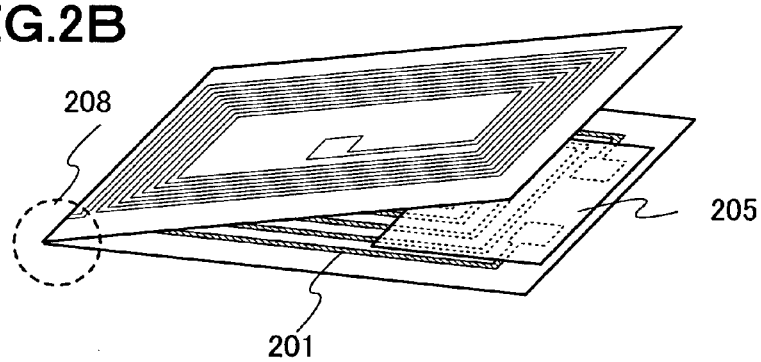

In FIG. 2B, the support 202 shown in FIG. 2A is folded along the dashed line 203 as the fold line. The support 202 is folded so that the antenna 201 and the thin film integrated circuit 205 are put inside the support 202. According to such a configuration, the antenna 201 and the thin film integrated circuit 205 can be disposed so as not to be exposed outside, resulting in improved mechanical strength of the wireless tag.

In order to prevent the overlapped portion of the antenna 201 from being connected by folding, the antenna 201 and the thin film integrated circuit 205 may be covered with resin or the like with insulating properties.

Figure 2C:
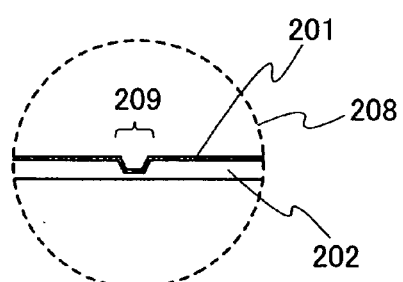

Depending on the thickness of the support 202, the support 202 is compressed at a periphery 208 of the dashed line 203 as the fold line, and the antenna 201 is broken. In order to prevent the breaking of the antenna 201, a depression 209 may be formed along the dashed line 203 as the fold line inside the support 202 as shown in FIG. 2C. The depression 209 allows to prevent the compression of the support 202 in folding, thereby the breaking of the antenna 201 can be prevented.

Figure 2D:
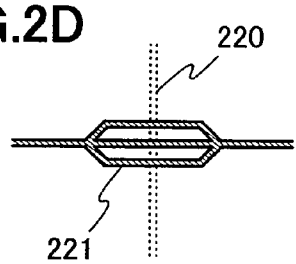
Figure 2E:
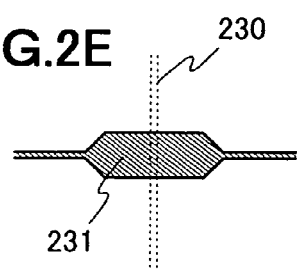

In addition, as shown in FIG. 2D, a part of an antenna 221 in a fold line 220 may be formed of a plurality of wirings connected in parallel to prevent the breaking. Alternatively, as shown in FIG. 2E, a part of an antenna 231 in a fold line 230 may be increased in width to prevent the breaking.

Note that in order to prevent the breaking, the antenna desirably crosses the fold line at as few points as possible. Instead, the antenna may be formed so as not to cross the fold line to prevent the breaking. FIG. 3A shows an example in which an antenna 302 is disposed only on one side of a fold line 303 on a support 301. In the case of FIG. 3A, the antenna 302 does not cross the fold line 303, thus the breaking in the fold line 303 can be prevented. The antenna 302 and a thin film integrated circuit are electrically connected at connecting terminals 304.

In a thin film integrated circuit according to the invention, radio waves are less shielded as compared with in an IC chip formed by using a semiconductor substrate. Therefore, even when the thin film integrated circuit is put in or surrounded by the antenna 201 as shown in FIGS. 2A to 2E, signal attenuation due to shielded radio waves can be prevented as compared with in the case of the IC chip. Thus, the area occupied by the antenna 201 can be made smaller as compared with in the case of the IC chip.

Although one side of the wireless tag is closed by folding the support in FIGS. 2A to 2E, the invention is not limited to this configuration. As shown in FIG. 3B, the wireless tag of the invention may have a support 311 two sides of which are closed or three sides of which are closed to be in bag shape. Further, all four sides of a support may be closed after a thin film integrated circuit is attached thereto.

In addition, the antenna 201 crosses the dashed line 203 as the fold line in FIGS. 2A to 2E, though the invention is not limited to this configuration. As shown in FIG. 3C, two antennas 321 and 322 disposed separately across a fold line may be electrically connected in folding to be collectively used as an antenna. In FIG. 3C, the antenna 321 and a thin film integrated circuit are electrically connected at connecting terminals 323, and a connecting terminal 324 and a connecting terminal 325 are electrically connected when folding a support 326.

In the case of FIG. 3C, the connecting terminals 324 and 325 are required to be electrically connected while the overlapped portion of the antennas 321 and 322 are required to be insulated except for the connecting terminals 324 and 325. As shown in FIG. 4A, the connecting terminals 324 and 325 may be covered with a conductive resin while the other part may be covered with an insulating resin 329. According to such a configuration, only the connecting terminals 324 and 325 can be electrically connected in the antennas 321 and 322. Note that in the invention, a method for electrically connecting the connecting terminals is not limited to the one using a conductive resin, and soldering or the like may also be adopted as well as solder balls formed on a surface of the connecting terminal.

Alternatively, the overlapped portion in folding the antennas 321 and 322 may be insulated with an insulating film used in a thin film integrated circuit. FIG. 4B shows an example in which the antenna 321 is covered with an insulating film of a thin film integrated circuit 330. The insulating film of the thin film integrated circuit 330 is formed so as to expose the connecting terminals 324 and 325. In that case, in view of the film thickness of the insulating film of the thin film integrated circuit 330, the connecting terminals 324 and 325 may be covered with a conductive resin to ensure electrical connection between the connecting terminals 324 and 325.

Although the two antennas are connected by folding the support in FIG. 3C, the two antennas may be respectively formed on two supports that are disposed separately. FIG. 3D shows an example in which two antennas 341 and 342 are formed on supports 343 and 344 respectively. Connecting terminals 346 and 347 of the two antennas 341 and 342 can be electrically connected by overlapping the two supports 343 and 344. However, in the case of FIG. 3D, as in the case of FIG. 3C, the connecting terminals 346 and 347 are required to be electrically connected while the overlapped portion of the antennas 341 and 342 are required to be insulated except for the connecting terminals 346 and 347. Accordingly, as shown in FIGS. 4A and 4B, a conductive resin and an insulating resin may be selectively applied or an insulating film of a thin film integrated circuit may be utilized.

Next, an example of a functional configuration of the wireless tag of the invention is described with reference to FIG. 5.

Reference numeral 400 denotes an antenna and 401 denotes a thin film integrated circuit. The antenna 401 includes an antenna coil 402 and a capacitor 403 formed in the antenna coil 402. The thin film integrated circuit 401 includes a demodulation circuit 409, a modulation circuit 404, a rectification circuit 405, a microprocessor 406, a memory 407, and a switch 408 for supplying a load to the antenna 400. Note that the memory 407 is not limited to one and a plurality of memories may be provided.

A signal transmitted from a reader/writer as radio waves is converted into an AC electrical signal by electromagnetic induction in the antenna coil 402. The AC electrical signal is demodulated in the demodulation circuit 409 and transmitted to the microprocessor 406 in the subsequent stage. Further, a power source voltage is generated by the AC electrical signal in the rectification circuit 405, and supplied to the microprocessor 406 in the subsequent stage.

In the microprocessor 406, various types of processing are performed in accordance with inputted signals. The memory 407 can be used not only for storing program, data and the like used in the microprocessor 406 but also as a work area in processing. A signal transmitted from the microprocessor 406 to the modulation circuit 404 is modulated into an AC electrical signal. The switch 408 can apply a load to the antenna coil 402 in accordance with the AC electrical signal from the modulation circuit 404. The reader/writer receives the load applied to the antenna coil 402 by radio waves, thereby reading a signal from the microprocessor 406 effectively.

Figure 5:
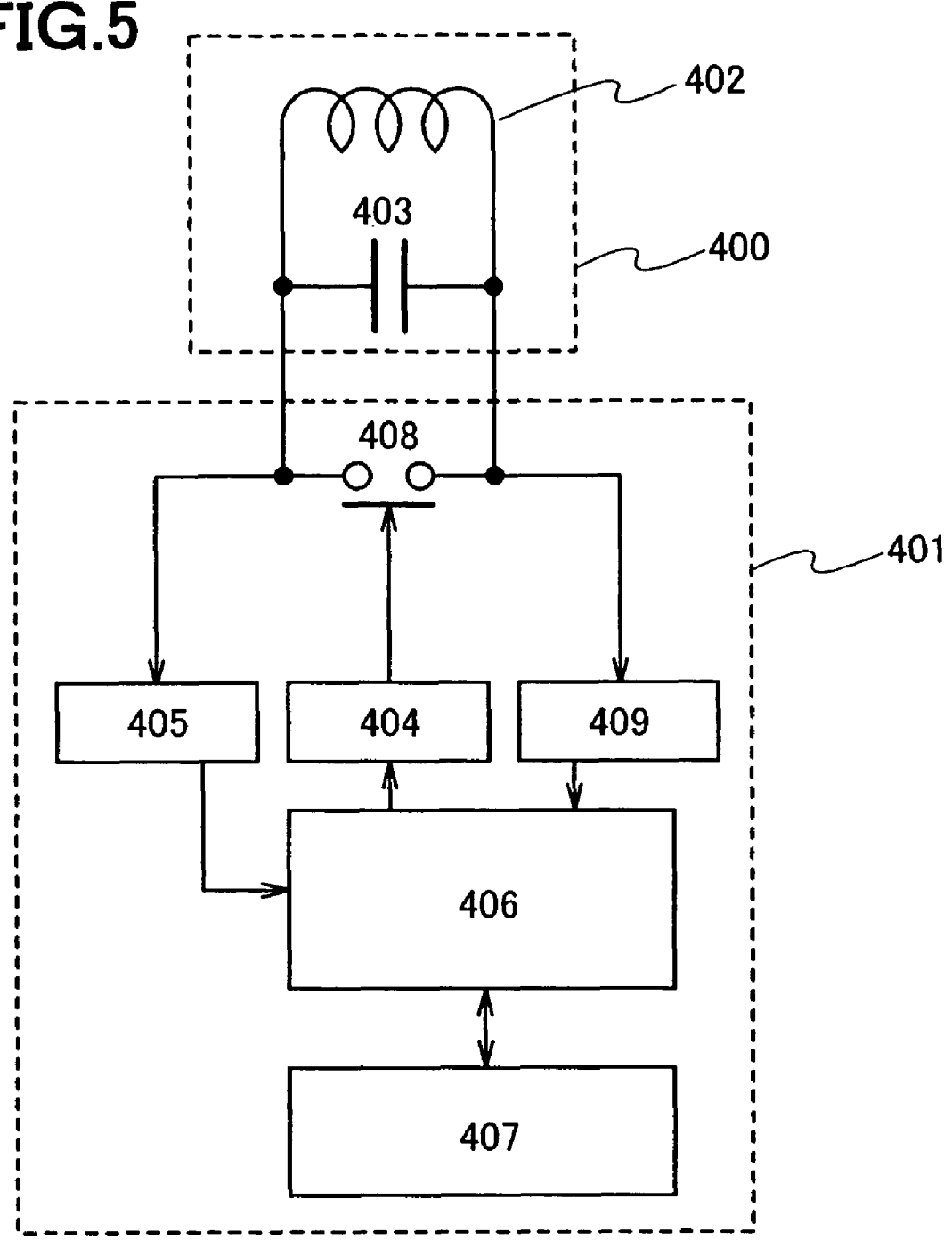
FIG. 5 is a block diagram showing a function of a thin film integrated circuit used in the wireless tag of the invention.

The aforementioned configuration of the wireless tag shown in FIG. 5 is just an example and the invention is not limited to this. A method of transmitting signals is not limited to the electromagnetic coupling method as shown in FIG. 5, and electromagnetic induction method, microwave method and other transmitting methods may also be adopted. Further, the wireless tag of the invention may include a function such as GPS.

A manufacturing method of the wireless tag of the invention is described with reference to FIGS. 6A to 6D and FIGS. 7A and 7B. FIGS. 6A to 6D and FIGS. 7A and 7B show an example in which a metal oxide film is provided between a high heat resistant substrate and a thin film integrated circuit, and the metal oxide film is weakened by crystallization so that the thin film integrated circuit is peeled off and attached to a flexible support. In addition, although an insulated TFT is taken as an example of a semiconductor element in FIGS. 6A to 6D and FIGS. 7A and 7B, the semiconductor element included in a thin film integrated circuit is not limited to this and any kind of circuit element may be used. For example, a memory, a diode, a photoelectric converter, a resister, a coil, a capacitor, an inductor and the like are typically used as well as the TFT.

Figure 6A:
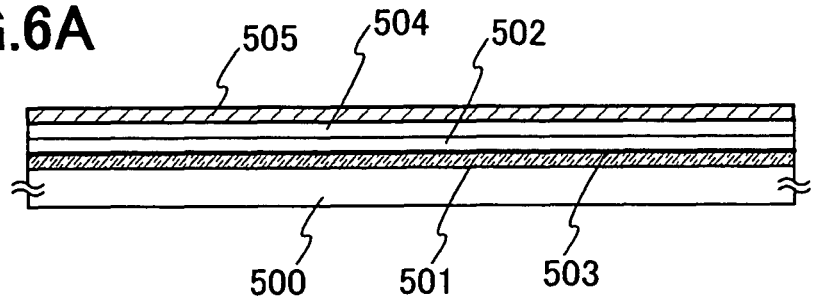
FIGS. 6A to 6D are diagrams showing a manufacturing method of the wireless tag of the invention.
Figure 6B:
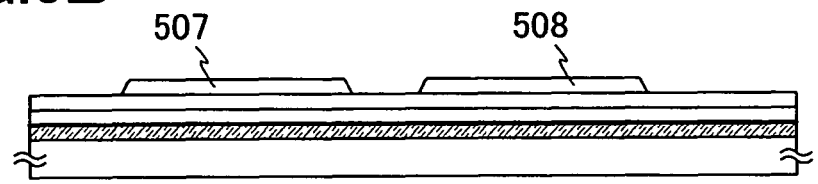

First, as shown in FIG. 6A, a metal film 501 is formed on a first substrate 500 by sputtering. The metal film 501 is formed of tungsten with a thickness of 10 to 200 nm, and preferably 50 to 75 nm. Although the metal film 501 is formed directly on the first substrate 500 in FIG. 6A, the first substrate 500 may be covered with an insulating film such as silicon oxide, silicon nitride and silicon nitride oxide before the metal film 501 is formed thereon.

After the metal film 501 being formed, an oxide film 502 as an insulating film is laminated thereon without being exposed to the atmosphere. The oxide film 502 is formed of a silicon oxide film with a thickness of 150 to 300 nm. In the case of the sputtering being adopted, the deposition is performed also on an edge of the first substrate 500. Therefore, in order to prevent the oxide film 502 from remaining on the first substrate 500 in the subsequent peeling step, it is preferable to selectively remove the metal film 501 and the oxide film 502 that are formed on the edge of the first substrate 500 by $O_2$ ashing and the like.

When forming the oxide film 502, presputtering is performed as the preliminary step of the sputtering, in which a target and the substrate are blocked off to generate plasma. The presputtering is performed by using Ar at a flow rate of 10 sccm and $O_2$ at a flow rate of 30 sccm while maintaining the first substrate 500 at a temperature of 270° C. and a deposition power at 3 kW. By the presputtering, an ultrathin metal oxide film 503 with a thickness of a few nanometers (3 nm herein) is formed between the metal film 501 and the oxide film 502. The metal oxide film 503 is obtained by oxidizing a surface of the metal film 501, thus the metal oxide film 503 is formed of tungsten oxide in FIG. 6A.

Although the metal oxide film 503 is formed by presputtering in FIG. 6A, the invention is not limited to this. For example, the surface of the metal film 501 may be intentionally oxidized with plasma by adding $O_2$ or a mixture of $O_2$ and an inert gas such as Ar in order to form the metal oxide film 503.

After the oxide film 502 being formed, a base film 504 as an insulating film is formed by PCVD. The base film 504 is formed of a silicon oxynitride film with a thickness of about 100 nm. Then, after the base film 504 being formed, a semiconductor film 505 is formed without being exposed to the atmosphere. The semiconductor film 505 is formed so as to have a thickness of 20 to 200 nm (preferably 40 to 170 nm).

Note that the semiconductor film 505 may be an amorphous semiconductor, a microcrystalline semiconductor (including a semi-amorphous semiconductor), or a polycrystalline semiconductor. In addition, not only silicon but also silicon germanium may be used as a semiconductor. In the case of the silicon germanium being used, germanium preferably has a concentration of about 0.01 to 4.5 atomic %.

The semiconductor film 505 may be crystallized by a known method such as thermal crystallization using an electric furnace, laser crystallization using laser light, and a lamp anneal crystallization using infrared light. Alternatively, crystallization using a catalytic element may also be performed based on the method disclosed in Japanese Patent Laid-Open No. 7-130652.

FIG. 6A shows an example in which the semiconductor film 505 is crystallized by laser crystallization. Before the laser crystallization, thermal annealing is performed to the semiconductor film 505 at a temperature of 500° C. for one hour in order to improve the resistance of the semiconductor film 505 to laser. This heat treatment increases the brittleness of the metal oxide film 503, thereby the first substrate 500 can be peeled off more easily in the subsequent step. By the crystallization, the metal oxide film 503 is weakened and easily broken in the grain boundary. In the case of FIG. 6A, a heat treatment is preferably performed at a temperature of 420 to 550° C. for about 0.5 to 5 hours to crystallize the metal oxide film 503.

It is possible to obtain a crystal with a large grain size when second to fourth harmonics of a fundamental harmonic are used with a continuous wave solid-state laser. Typically, it is preferable to use the second harmonic (532 nm) or the third harmonic (355 nm) of an Nd:YVO$_4$ laser (fundamental harmonic: 1064 nm). More specifically, laser light emitted from a continuous wave YVO$_4$ laser is converted to the harmonic with a non-linear optical element to obtain laser light having an output of 10 W. More preferably, the laser light is formed so as to be a rectangular shape or an elliptical shape by an optical system, and irradiated on a surface of the semiconductor film 505. At this time, an energy density of about 0.01 to 100 MW/cm$^2$ (preferably 0.1 to 10 MW/cm$^2$) is required. The laser light is irradiated at a scan rate of about 10 to 2000 cm/sec.

Alternatively, the laser crystallization may be performed by using pulsed laser light with a oscillation frequency of 10 MHz or more which is a much higher frequency than that of tens to hundreds of Hz of a normally used pulsed laser. It is said that it takes tens to hundreds of nsec to completely solidify a semiconductor film after irradiating pulsed laser light thereto. Accordingly, by using the aforementioned frequency range, pulsed laser light can be irradiated before a semiconductor film dissolved by the preceding laser light becomes solidified. Thus, solid-liquid interface can be sequentially moved in a semiconductor film, thereby forming a semiconductor film having crystal grains that are sequentially grown in the scan direction. More specifically, a group of crystal grains each having a grain width of 10 to 30 μm in the scan direction and 1 to 5 μm in the direction perpendicular to the scan direction can be obtained. Accordingly, single crystal grains extending along the scan direction are formed, and a semiconductor film with few crystal grain boundaries at least in the channel length of a TFT can be achieved.

In the laser crystallization, continuous wave fundamental laser light and continuous wave harmonic laser light may be irradiated, or continuous wave fundamental laser light and harmonic pulsed laser light may be irradiated.

The laser irradiation may be performed in an inert gas atmosphere such as a noble gas and an inert gas such as nitrogen. According to this, unevenness of a surface of a semiconductor due to laser irradiation can be suppressed, which prevents variations in threshold caused by variations in interface state density.

According to the aforementioned laser irradiation to the semiconductor film 505, the crystallinity of the semiconductor film can be much improved. Note that as the semiconductor film 505, a polycrystalline semiconductor may be formed in advance by sputtering, plasma CVD, thermal CVD and the like.

Although the semiconductor film is crystallized in FIG. 6A, the subsequent step may be performed by using an amorphous silicon film which is not crystallized. Alternatively, a microcrystalline semiconductor may also be used. A TFT using an amorphous semiconductor or a microcrystalline semiconductor (including a semi-amorphous semiconductor) has the advantage in that it can be formed by fewer manufacturing steps than a TFT using a polycrystalline semiconductor, resulting in improved cost and yield. In that case, a heat treatment is performed additionally in order to increase the brittleness of the metal oxide film 503.

The semi-amorphous semiconductor is a semiconductor having an intermediate structure between amorphous and crystalline (including single crystalline and polycrystalline) structures. This semiconductor has a third state that is stable in free energy, and it is a kind of a crystalline semiconductor that has a short range order and a lattice distortion. The semi-amorphous semiconductor film with crystal grains of 0.5 to 20 nm can be dispersed in an amorphous semiconductor and Raman spectrum is shifted to the lower frequency band than 520 cm$^{-1}$. The semi-amorphous semiconductor has an x-ray diffraction pattern with peaks at (111) and (220) that are considered to be due to Si crystal lattice. Further, the semiconductor is mixed with at least 1 atom % of hydrogen or halogen as the neutralizing agent for dangling bond. Such a semiconductor is called herein a semi-amorphous semiconductor (SAS) for convenience. When a noble gas element such as helium, argon, krypton, or neon is mixed into an SAS, the lattice distortion is increased and the stability is thus enhanced, leading to a high quality SAS.

Subsequently, the semiconductor film 505 is patterned to form island-shaped semiconductor films 507 and 508 with which various semiconductor elements typified by a TFT are formed. Although the island-shaped semiconductor films 507 and 508 are formed directly on the base film 504 in FIG. 6B, an electrode, an insulating film or the like may be formed between the base film 504 and the island-shaped semiconductor films 507 and 508 depending on a semiconductor element. For example, in the case of a bottom gate TFT that is one of the semiconductor elements, a gate electrode and a gate insulating film are formed between the base film 504 and the island-shaped semiconductor films 507 and 508.

Figure 6C:
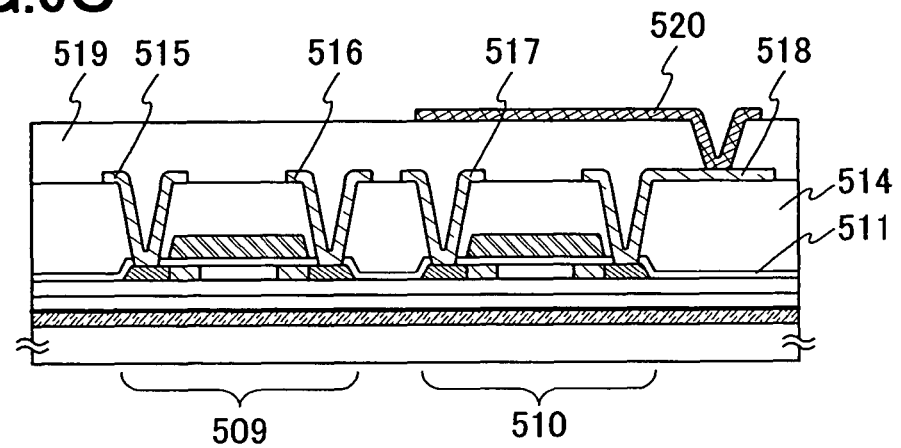

In FIGS. 6A to 6D and FIGS. 7A and 7B, top gate TFTs 509 and 510 are formed by using the island-shaped semiconductor films 507 and 508 respectively (FIG. 6C). Specifically, a gate insulating film 511 is formed so as to cover the island-shaped semiconductor films 507 and 508, and a conductive film is formed on the gate insulating film 511 and patterned to obtain a gate electrode. Then, an impurity that imparts an N-type conductivity is added to the island-shaped semiconductor films 507 and 508 with the gate electrode or a deposited and patterned resist used as a mask, thereby a source region, a drain region and an LDD region are formed. Note that N-type TFTs are used for both the TFTs 509 and 510, however, in the case of P-type TFTs being used, an impurity that imparts a P-type conductivity is added. Through the aforementioned steps, the TFTs 509 and 510 can be obtained.

After the gate insulating film 511 being formed, the island-shaped semiconductor films 507 and 508 may be hydrogenated by heat treatment at a temperature of 300 to 450° C. for 1 to 12 hours in an atmosphere containing 3 to 100% of hydrogen. The hydrogenation may also be performed by plasma hydrogenation (using hydrogen excited by plasma). This hydrogenation step allows to terminate dangling bonds of the semiconductor film by thermally excited hydrogen. In addition, even when a defect occurs in a semiconductor film by bending a flexible support on which a semiconductor element is attached in the subsequent step, since the semiconductor film includes hydrogen with a concentration of $1 \times 10^{19}$ to $5 \times 10^{21}$ atoms/cm$^3$ by the hydrogenation, the defect can be terminated by hydrogen included in the semiconductor film. Further, the semiconductor film may include halogen to terminate the defect.

The manufacturing method of the TFT is not limited to the aforementioned one.

Subsequently, a first interlayer insulating film 514 is formed so as to cover the TFTs 509 and 510. After contact holes are formed in the gate insulating film 511 and the first interlayer insulating film 514, wirings 515 to 518 are formed directly on the first interlayer insulating film 514 so as to be connected to the TFTs 509 and 510 through the contact holes.

Then, a second interlayer insulating film 519 is formed on the first interlayer insulating film 514 so as to cover the wirings 515 to 518. After a contact hole is formed in the second interlayer insulating film 519, a connecting terminal 520 is formed directly on the second interlayer insulating film 519 so as to be connected to the wiring 518 through the contact hole. The first interlayer insulating film 514 and the second interlayer insulating film 519 may be formed of an organic resin film, an inorganic insulating film, an insulating film that is formed of a siloxane based material and includes Si—O—Si bonding (hereinafter a siloxane based insulating film), and the like. The siloxane based insulating film may include a hydrogen substituent as well as a material that has one or more substituents selected from fluorine, an alkyl group, and aromatic hydrocarbon. The siloxane based insulating film has heat resistance to a wire using a material having a high melting point such as gold, thus it is effectively used for wire bonding.

Figure 6D:
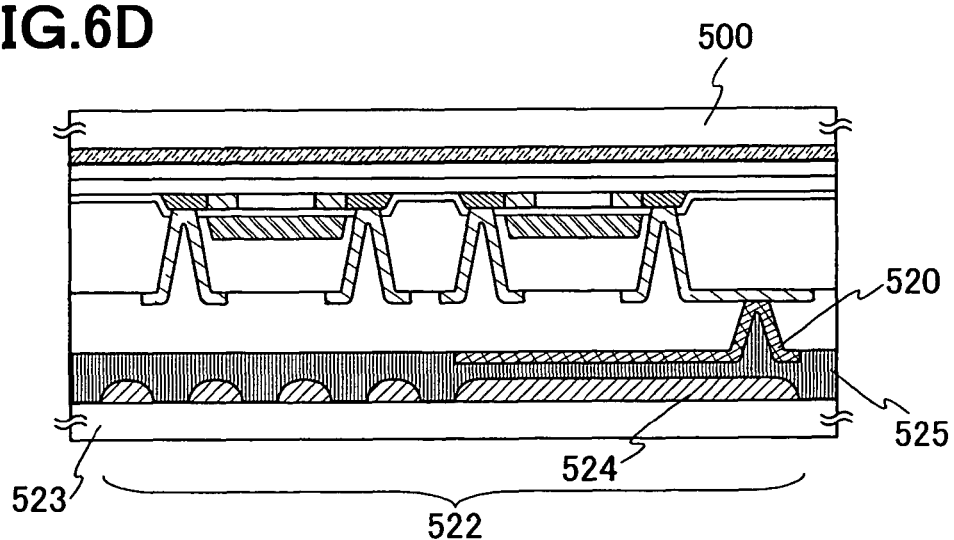

Next, as shown in FIG. 6D, an antenna 522 is formed on a second substrate 523 functioning as a flexible support. The antenna 522 comprises a connecting terminal 524 and can be formed by printing, photolithography, vapor deposition, or droplet ejection. In the case of the antenna 522 being formed by droplet ejection, a surface of the second substrate 523 is desirably processed so as to increase the adhesiveness of the antenna 522.

A plastic substrate can be used for the flexible second substrate 523, for example. As the plastic substrate, ARTON (product of JSR) formed of polynorbornene having a polar group can be used. It is also possible to use polyester typified by polyethylene terephthalate (PET), polyether sulfone (PES), polyethylene naphthalate (PEN), polycarbonate (PC), nylon, polyether ether ketone (PEEK), polysulfone (PSF), polyether imide (PEI), polyarylate (PAR), polybutylene terephthalate (PBT), polyimide, acrylonitrile butadiene styrene resin, polyvinyl chloride, polypropylene, polyvinyl acetate, acrylic resin and the like. The second substrate 523 desirably has high thermal conductivity of about 2 to 30 W/mK in order to diffuse the heat generated from a thin film integrated circuit.

A method of increasing the adhesiveness specifically includes a method of attaching to the surface of the second substrate 523 a metal or a metal compound for increasing the adhesiveness of a conductive film or an insulating film by catalysis, a method of attaching to the surface of the second substrate 523 an organic insulating film, a metal, or a metal compound with increased adhesiveness to a conductive film or an insulating film, a method of applying plasma treatment to the surface of the second substrate 523 in an atmospheric pressure or a reduced pressure to modify the surface, and the like. The metal with increased adhesiveness to a conductive film or an insulating film includes titan and titan oxide as well as a 3d transition element such as Sc, Ti, V, Cr, Mn, Fe, Co, Ni, Cu, and Zn. The metal compound includes the oxide, nitride, and oxynitride of these metals. The organic insulating film includes polyimide, a siloxane based insulating film and the like. The siloxane based insulating film may include a hydrogen substituent as well as a material that has one or more substituents selected from fluorine, an alkyl group, and aromatic hydrocarbon.

In the case where the metal or the metal compound attached to the second substrate 523 has conductivity, the sheet resistance thereof is controlled in order not to prevent normal operation of the antenna 522. Specifically, the metal or the metal compound with conductivity is controlled to have an average thickness of 1 to 10 nm for example, or the metal or the metal compound is insulated partially or entirely by oxidization. Alternatively, the metal or the metal compound may be selectively removed by etching except for a region required to have increased adhesiveness. Instead, the metal or the metal compound is not attached to the entire surface of the substrate but selectively attached only to a predetermined region by droplet ejection, printing, sol-gel method and the like. Note that the metal or the metal compound formed on the surface of the second substrate 523 is not required to be a completely continuous film and may be dispersed to some extent.

In this embodiment mode, a photocatalyst such as ZnO and TiO$_2$ is attached to the surface of the second substrate 523 to increase the adhesiveness by a photocatalytic reaction. More specifically, ZnO or TiO$_2$ dispersed in a solvent is sprayed on the surface of the second substrate 523. Alternatively, a ZnO compound or a Ti compound is attached to the surface of the second substrate 523 and then oxidized or processed by sol-gel method, thereby ZnO or TiO$_2$ can be attached to the surface of the second substrate 523.

Subsequently, by droplet ejection or various printing methods, the antenna 522 is formed on the surface of the second substrate 523 to which the pretreatment for increasing the adhesiveness has been performed. More specifically, the antenna 522 can be formed of a conductive material including one or more metals selected from Ag, Au, Cu, and Pd or metal compounds. It is also possible to use a conductive material including one or more metals selected from Cr, Mo, Ti, Ta, W, and Al or metal compounds as long as the aggregation thereof can be suppressed to be dispersed in a solution by a dispersant. Further, when a deposition of a conductive material by droplet ejection or various printing methods is performed plural times, a gate electrode with laminated conductive films can also be obtained. Alternatively, conductive particles of Cu coated with Ag can be employed as well.

In the case of the droplet ejection being adopted, the conductive material dispersed in an organic or inorganic solvent is ejected from a nozzle, then dried or baked at a room temperature to obtain the antenna 522. For example, in the case of polycarbonate being used for the second substrate 523, a solution of tetradecane dispersed with Ag is ejected and baked at a temperature of about 200° C. for 1 minute to 50 hours to remove the solvent, thereby the antenna 522 is formed. Note that Ag is preferably used for the antenna 522 since it costs less than Au and can meet environmental standards more easily than Cu. In the case of an organic solvent being used, the solvent can be removed efficiently by performing the baking in an oxide atmosphere, and the resistance of the antenna 522 can thus be further lowered.

After the solution in which the conductive material is dispersed is ejected, the ejected conductive material is pressed before baking, thereby the density of the conductive material in the antenna 522 can be increased and the film thickness can be controlled. Accordingly, the flexibility of the antenna 522 can be increased while the resistance can be further lowered.

In the case of the droplet ejection being adopted, patterning accuracy depends on the ejection rate per droplet, the surface tension of the solution, the water-shedding properties of the surface of the second substrate 523 to which a droplet is ejected, and the like. Therefore, these conditions are preferably optimized in accordance with a predetermined patterning accuracy.

Then, as shown in FIG. 6D, the connecting terminal 524 of the antenna 522 is electrically connected to the connecting terminal 520 of the thin film integrated circuit shown in FIG. 6C. More specifically, the first substrate 500 and the second substrate 523 are attached with an anisotropic conductive resin 525 so that the connecting terminal 520 and the connecting terminal 524 are electrically connected.

Although the first substrate 500 and the second substrate 523 are attached with the anisotropic conductive resin 525 in FIG. 6D, the invention is not limited to this. For example, the anisotropic conductive resin may be used for attaching an overlapping area of the connecting terminal 524 of the antenna 522 and the connecting terminal 520 of the thin film integrated circuit, and an insulating resin or the like may be used for attaching the other area.

Figure 7A:
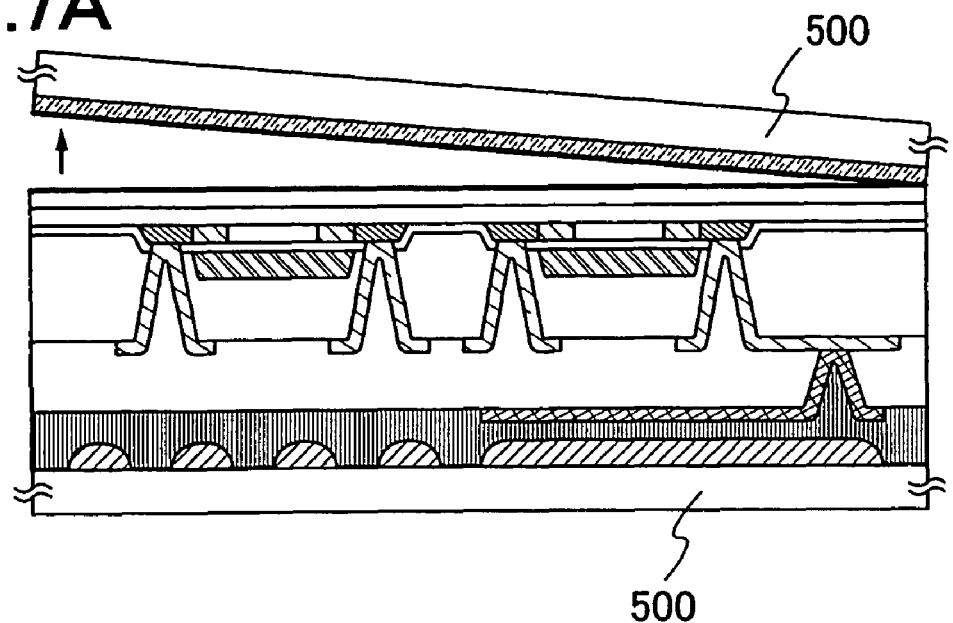
FIGS. 7A and 7B are diagrams showing a manufacturing method of the wireless tag of the invention.

Next, preparatory step for the peel-off is conducted so that the adhesiveness between the metal oxide film 503 and the oxide film 502 or the adhesiveness between the metal oxide film 503 and the metal film 501 is partially weakened. Specifically, the preparatory step for the peel-off is performed by locally applying pressure from outside on the region to be peeled off along the periphery thereof so as to partially damage inside or an edge of the metal oxide film 503. In FIG. 7A, a hard needle such as a diamond pen is pressed perpendicular to the edge and vicinity of the metal oxide film 503 and moved along with the metal oxide film 503 with applying pressure. Preferably, a scriber device may be used to move with applying pressure on the region with press force ranging from 0.1 to 2 mm. By performing such preparatory step for partially weakening the adhesiveness, defects in peeling off can be reduced and the production yield can be improved.

Then, the metal film 501 and the oxide film 502 are physically detached, thereby the first substrate 500 is peeled off. The peel-off is started from a region in which the adhesiveness between the metal oxide film 503 and the metal film 501 or the adhesiveness between the metal oxide film 503 and the oxide film 502 is partially weakened in the preceding step.

According to the peel-off, the metal oxide film 503 is separated partially from the metal film 501, partially from the oxide film 502, and the metal oxide film 503 itself is partially separated into two sides. Thus, the semiconductor elements (the TFTs 509 and 510 herein) are detached from the first substrate 500 while being attached to the second substrate 523. The peel-off can be performed by relatively small force (for example, man's hand, air pressure of gas sprayed from a nozzle, ultrasonic waves or the like). FIG. 7A shows a state after the peel-off.

In the case of the rigidity of the first substrate 500 being low, the first substrate 500 may be damaged or the semiconductor elements may be overloaded in peeling. In that case, a third substrate may be additionally provided to add rigidity to the first substrate 500. More specifically, the third substrate is attached to the first substrate 500 with a two-sided tape, an adhesive and the like. For the third substrate, a substrate having higher rigidity than that of the first substrate 500, such as a quartz substrate and a semiconductor substrate, is preferably to be used.

Figure 7B:
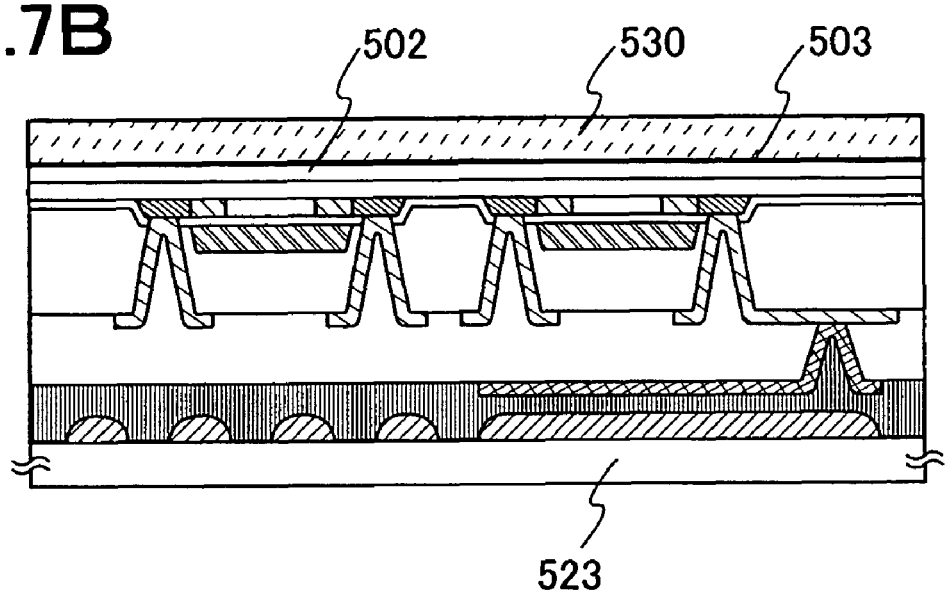

Subsequently, as shown in FIG. 7B, a protective layer 530 is formed so as to cover the oxide film 502 to which the metal oxide film 503 is partially attached. The protective layer 530 protects the semiconductor elements such as the TFTs 509 and 510. The protective layer 530 can be formed of an organic resin film, an inorganic insulating film, and a siloxane based insulating film. More preferably, the protective layer 530 contains powder composed of silver, nickel, aluminum, and aluminum nitride, or filler to have high thermal conductivity. Increased thermal conductivity allows the heat generated from the semiconductor elements such as the TFTs 509 and 510 used in the thin film integrated circuit to be released effectively.

An adhesive may be used as the protective layer 530 and the semiconductor elements such as the TFTs 509 and 510 may be covered with a substrate that is additionally provided. In that case, the thin film integrated circuit using the semiconductor elements such as the TFTs 509 and 510 is disposed between the second substrate 523 and the substrate attached to the protective layer 530. For the adhesive, various types of curable adhesive, for example, a photocurable adhesive such as a reaction curable adhesive, a heat curable adhesive and a UV curable adhesive, or an anaerobic adhesive can be utilized.

Although the metal film 501 is formed of tungsten in FIGS. 6A to 6D and FIGS. 7A and 7B, the material of the metal film is not limited to this in the invention. Any material containing metal can be utilized as long as the metal oxide film 503 can be formed thereon and the substrate can be detached by crystallizing the metal oxide film 503. For example, TiN, WN, Mo and the like or an alloy of these materials can be employed. In the case of the alloy containing W being used as the metal film, the optimum temperature of heating in crystallization is varied in accordance with a composition ratio thereof. Therefore, by varying the composition ratio, heat treatment can be performed at the temperature that does not obstruct the manufacturing steps of the semiconductor elements, and the semiconductor elements can thus be manufactured with few restrictions.

According to the aforementioned manufacturing method, the thin film integrated circuit can be drastically reduced in thickness to have a total thickness of 0.3 to 3 μm, and typically about 2 μm. In addition, by using the flexible substrate typified by a plastic substrate, mechanical strength of the wireless tag can be increased while reducing the thickness. Note that the thickness of the thin film integrated circuit includes the thickness of the insulating film formed between the metal oxide film and the semiconductor element and the thickness of the interlayer insulating film covering the semiconductor element as well as the thickness of the semiconductor element itself. Thus, the thickness of the thin film integrated circuit does not include the thicknesses of the second substrate 523 functioning as a support, the protective layer 530, the anisotropic conductive resin 525, and the antenna 522. The thin film integrated circuit occupies an area of 5 mm square or less, and more preferably 0.3 to 4 mm square.

When the thin film integrated circuit is disposed at the center of the total thickness of the protective layer 530, the anisotropic conductive resin 525 and the antenna 522 laminated over the second substrate 523, mechanical strength of the thin film integrated circuit can be increased. More specifically, on the assumption that the total thickness of the protective layer 530, the thin film integrated circuit, the anisotropic conductive resin 525, and the antenna 522 is d, the thicknesses of the protective layer 530, the anisotropic conductive resin 525 and the antenna 522 are preferably controlled so that the distance x between the second substrate 523 and the center of the thin film integrated circuit in the direction of the thickness satisfies the following formula 1.

$$\frac{1}{2}d - 30 \ \mu m < x < \frac{1}{2}d + 30 \ \mu m \quad \text{[Formula 1]}$$

Before the TFTs 509 and 510 are covered with the first interlayer insulating film 514, they may be covered with a silicon nitride film or a silicon nitride oxide film that is prepared separately. According to this, the TFTs 509 and 510 are covered with the base film 504 and the silicon nitride film or the silicon nitride oxide film. Therefore, an alkaline metal such as Na or an alkaline earth metal can be prevented from diffusing into a semiconductor film used for the semiconductor element and adversely affecting characteristics of the semiconductor element.

In the case where in order to maintain the flexibility of the wireless tag, an organic resin is used for the protective layer 530 that is in contact with the oxide film 502 and the metal oxide film 503, when a silicon nitride film or a silicon nitride oxide film is used as the base film 504, an alkaline metal such as Na or an alkaline earth metal can be prevented from diffusing from the organic resin into the semiconductor film through the oxide film 502.

A serial number marked on a semiconductor film or an insulating film used in the wireless tag allows to determine the distribution route thereof to some extent even when an IC card which does not store image data in a ROM yet is transferred to a third party due to theft or the like. In that case, it is more effective to mark the serial number on a position that cannot be erased unless a semiconductor device is decomposed to the extent that cannot be recomposed.

FIGS. 6A to 6D and FIGS. 7A and 7B show an example in which a thin film integrated circuit is attached to a flexible support. However, a thin film integrated circuit may be attached directly to an object.

Figure 8A:
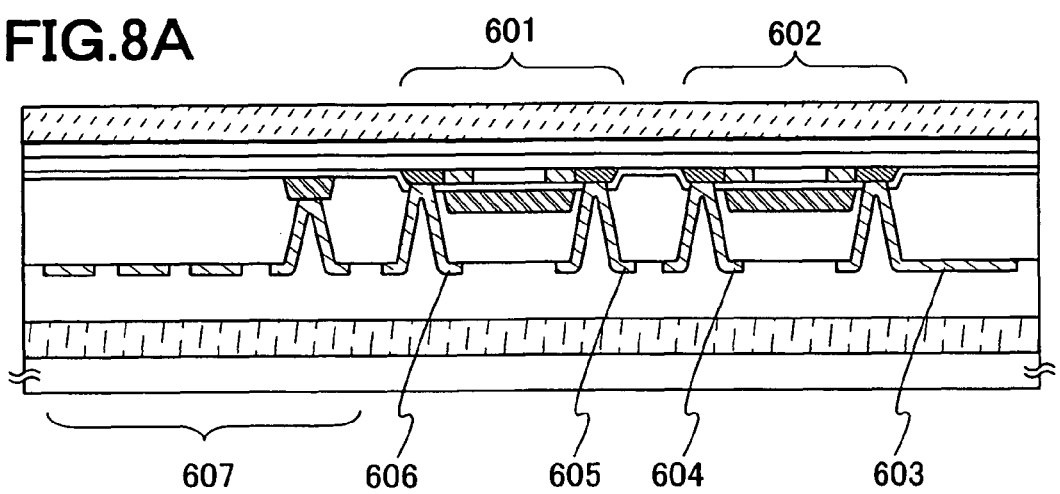
FIGS. 8A and 8B are diagrams showing configurations of the wireless tag of the invention.
Figure 8B:
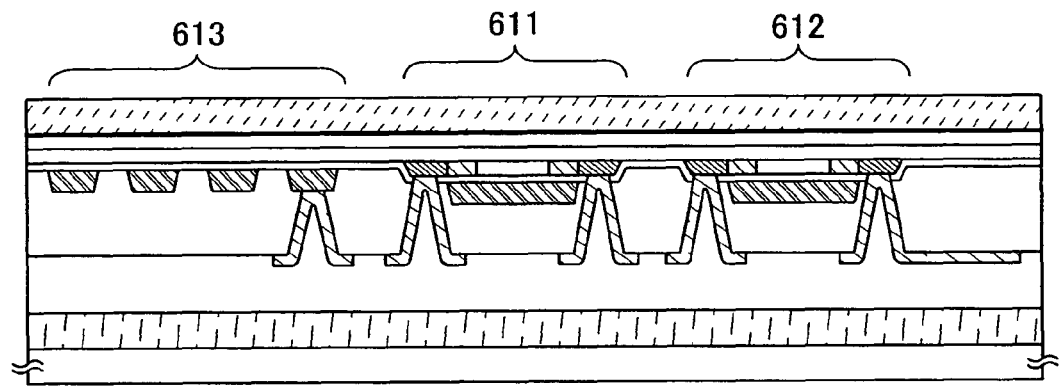

Further, FIGS. 6A to 6D and FIGS. 7A and 7B show an example in which a thin film integrated circuit is attached and connected to an antenna that is formed separately, though the invention is not limited to this configuration. An antenna and a thin film integrated circuit may be formed on the same substrate and collectively attached to a support or an object. FIG. 8A shows an example in which wirings 603 to 606 connected to source regions or drain regions of TFTs 601 and 602 and an antenna 607 are formed of the same conductive film. FIG. 8B shows an example in which gate electrodes of TFTs 611 and 612 and an antenna 613 are formed of the same conductive film. In the case of FIGS. 8A and 8B, the thin film integrated circuit and the antenna can be formed at a time without additional manufacturing steps, and the peel-off and attachment can be performed at a time.

Figure 9:
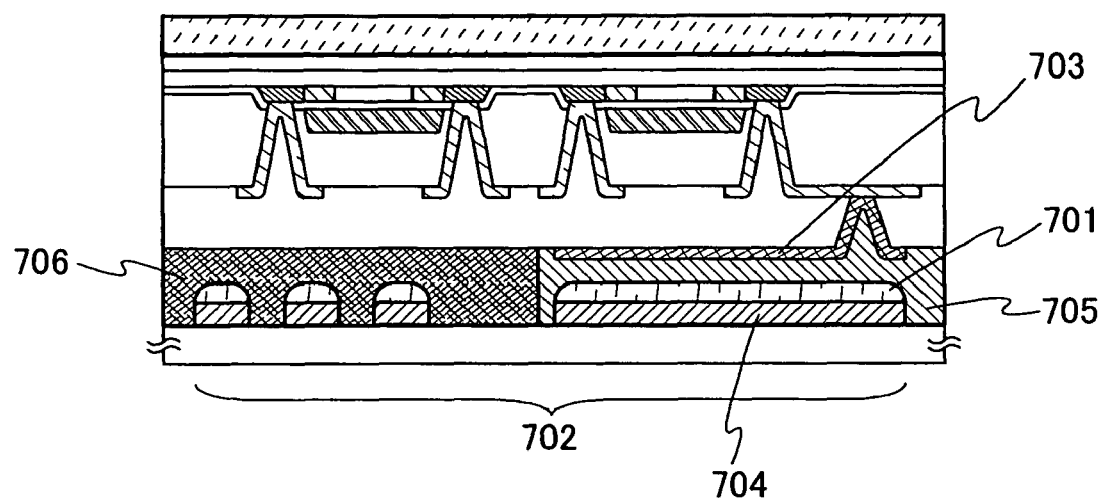
FIG. 9 is a diagram showing a configuration of the wireless tag of the invention.

Further, FIGS. 6A to 6D and FIGS. 7A and 7B show an example in which the antenna is formed by printing or droplet ejection, though the invention is not limited to this configuration and it may be formed by photolithography or vapor deposition using a metal mask as described above. FIG. 9 shows a cross sectional view of an example of the wireless tag whose antenna is formed by photolithography. Reference numeral 701 denotes a mask used for patterning an antenna 702. The mask 701 may be removed after the patterning, though it may also be left in view of the reduction in the number of manufacturing steps as shown in FIG. 9. In the case of FIG. 9, a connecting terminal 703 of a thin film integrated circuit and a connecting terminal 704 of the antenna 702 are connected by attaching edges of the terminals 703 and 704 with a conductive resin 705 and attaching the other area with an insulating resin 706.

The attachment of a thin film integrated circuit is not limited to the one using a metal oxide film as shown in FIGS. 6A to 6D and FIGS. 7A and 7B. For example, various attaching methods can be used: a method in which an amorphous silicon film containing hydrogen is formed between a high heat resistant substrate and a thin film integrated circuit, and the thin film integrated circuit is peeled off from the substrate by removing the amorphous silicon film by laser irradiation or etching; and a method in which a high heat resistant substrate on which a thin film integrated circuit is formed is removed mechanically or by etching using solution or gas to peel off the thin film integrated circuit from the substrate.

For example, in the case of an amorphous silicon film being removed by etching, an amorphous silicon film with a thickness of about 1 μm is formed on a high heat resistant substrate. Then, on the amorphous silicon film, a silicon oxide film with a thickness of 100 nm is formed as a base film, and semiconductor elements such as TFTs are formed on the base film. After the semiconductor element is covered with a protective film such as an inorganic insulating film, an organic resin film and a siloxane based insulating film, the semiconductor elements are separated from each other by scribing so as to separate thin film integrated circuits from each other. The scribing is not required to be performed to the depth that separates the substrate but only required to be performed to the depth that separates the base film. Subsequently, the amorphous silicon film is etched by fluorine halide such as $ClF_3$ and removed. The fluorine halide may be either a gas or a liquid. In that case, in order to protect the semiconductor elements from the fluorine halide, a silicon nitride film or a silicon nitride oxide film is preferably formed between the amorphous silicon film and the semiconductor elements. When the silicon nitride film or the silicon nitride oxide film is provided, an alkaline metal such as Na or an alkaline earth metal can be prevented from diffusing into semiconductor films used for the semiconductor elements and adversely affecting characteristics of the semiconductor elements. Through the aforementioned steps, the thin film integrated circuit can be peeled off from the substrate. The peeled thin film integrated circuit can be attached directly to a flexible support or an object.

In the case where an object has a curved surface and thus a support of a wireless tag attached to the curved surface is bent to have a curved surface drawn by a generating line such as pyramidal surface and a cylindrical surface, the direction of the generating line is preferably the same as that of carriers moving in TFTs. According to such a structure, it is possible to prevent characteristics of TFTs from being adversely affected by the bent support. In addition, when island-shaped semiconductor films occupy 5 to 30% of the area in a thin film integrated circuit, it is possible to further prevent characteristics of TFTs from being adversely affected by the bent support.

EMBODIMENT 1

Described in this embodiment is an example of forming a plurality of wireless tags by using a large substrate.

Figure 10A:
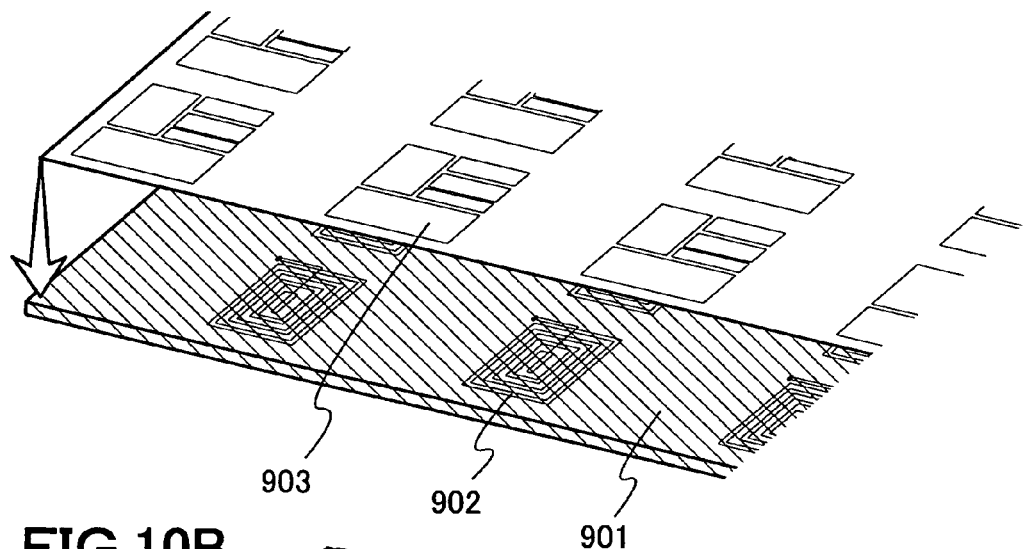
FIGS. 10A to 10C are diagrams showing a manufacturing method of the wireless tag of the invention using a large support.

FIG. 10A shows a case in which a plurality of antennas 902 used for wireless tags are formed on a large flexible substrate 901 functioning as a support. At the same time, a plurality of thin film integrated circuits 903 are attached onto the flexible substrate 901 in FIG. 10A. When being attached, the thin film integrated circuits 903 are electrically connected to the antennas 902.

Figure 10B:
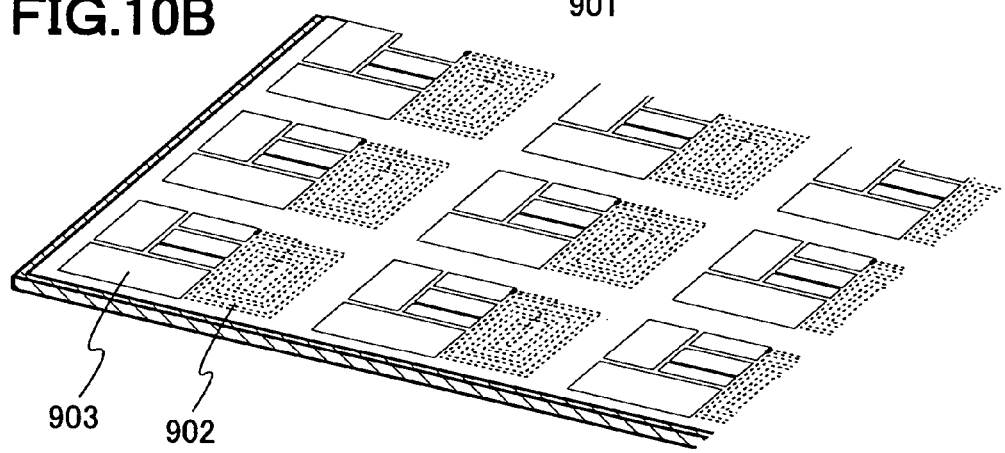

FIG. 10B shows a case in which the plurality of thin film integrated circuits 903 are attached onto the substrate 901. Although the antennas 902 and the thin film integrated circuits 903 are disposed to be adjacent to each other in FIG. 10B, the invention is not limited to this configuration. The antennas 902 and the thin film integrated circuits 903 may be overlapped to have a stacked structure.

Figure 10C:
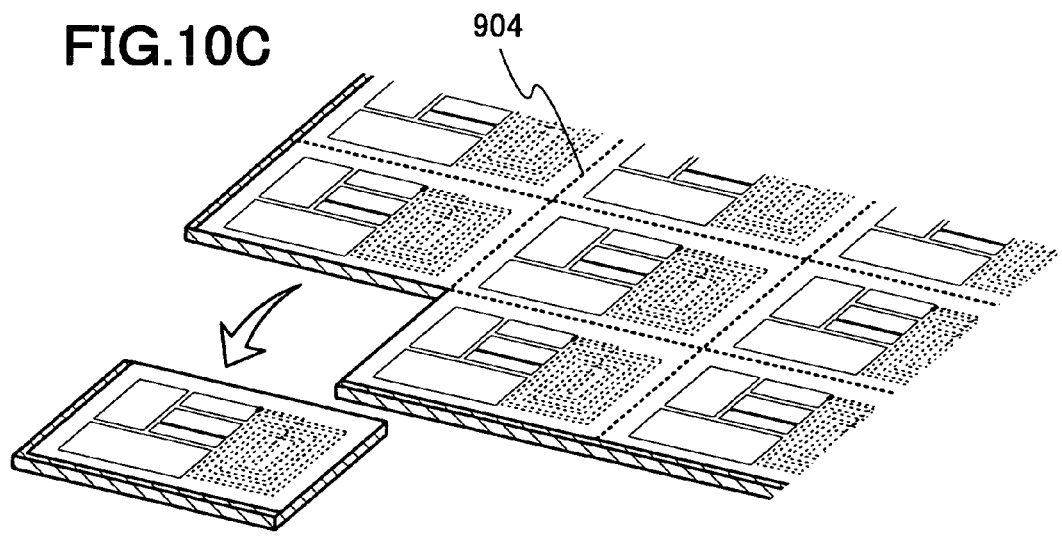

Then, as shown in FIG. 10C, scribing or dicing is performed along a dashed line 904 to separate the wireless tags from each other. The wireless tag may be completed in this condition, or may be completed after being sealed with a sealing member. Note that the separation of the wireless tags may be performed by laser irradiation.

EMBODIMENT 2

In this embodiment, applications of the wireless tag of the invention are described.

The wireless tag of the invention can be applied to various fields. For example, the wireless tag of the invention can be attached to a product label to control the flow of product.

Figure 11A:
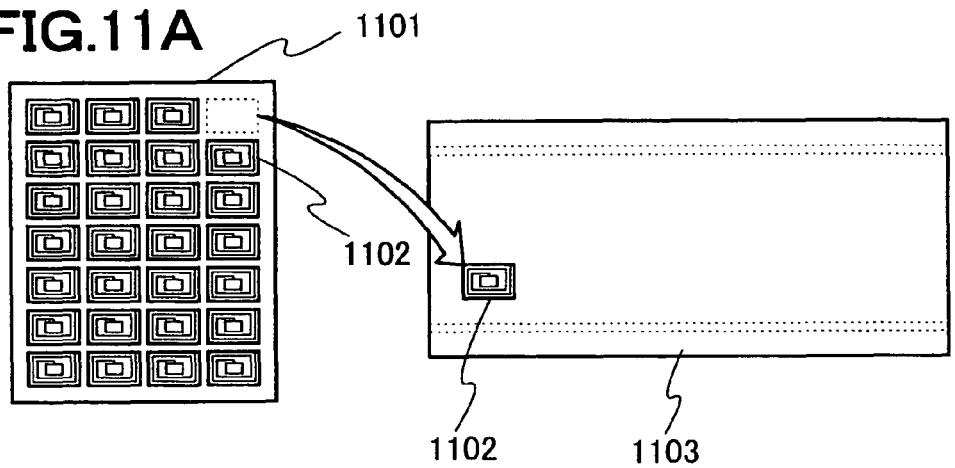
FIGS. 11A to 11C are views showing applications of the wireless tag of the invention.
Figure 11B:
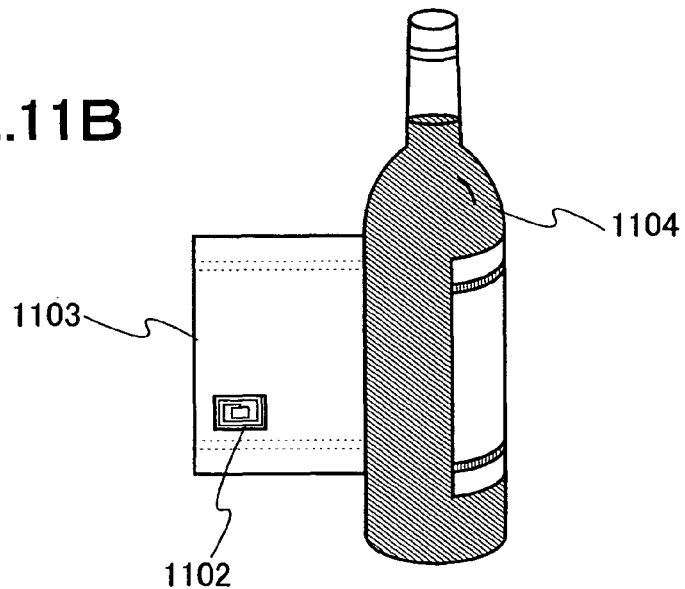

As shown in FIG. 11A, a wireless tag 1102 of the invention is formed on a support with a sticky backside such as a seal 1101 and then attached to a product label 1103. Subsequently, as shown in FIG. 11B, the label 1103 attached with the wireless tag 1102 is put on a product 1104.

Figure 11C:
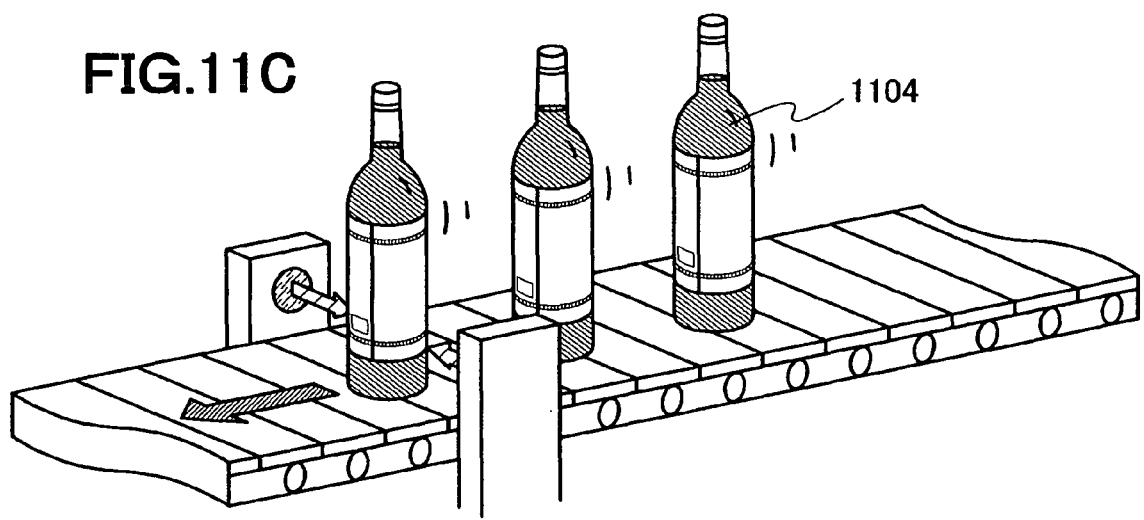
Figure 12:
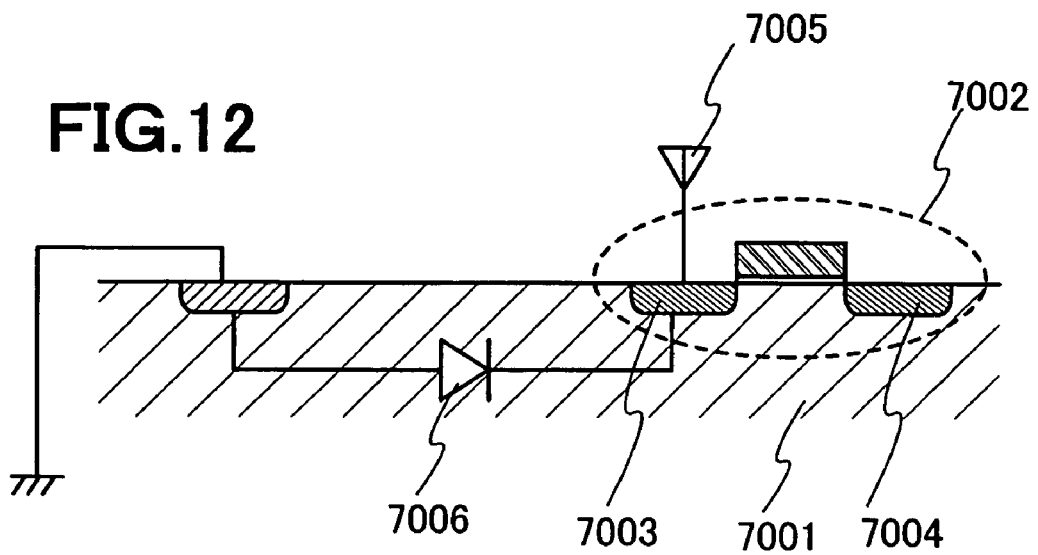
FIG. 12 is a diagram showing a problem in a wireless tag having an IC chip formed by using a semiconductor substrate.

Identification data of the product 1104 can be wirelessly read from the wireless tag 1102 attached to the label 1103 as shown in FIG. 11C. Therefore, the wireless tag 1102 facilitates the control of product in the distribution process.

For example, in the case of a nonvolatile memory being used as a memory of a thin film integrated circuit in the wireless tag 1102, the distribution process of the product 1104 can be recorded. In addition, when the production process of the product is recorded, a wholesaler, a retailer and a consumer can easily find out a production area, a producer, a date of manufacture, a processing method and the like.

This embodiment shows only an example of the application of the wireless tag of the invention. The application of the wireless tag of the invention is not limited to the one shown in FIGS. 11A to 11C, and various applications are possible.

EMBODIMENT 3

In this embodiment, applications of the wireless tag of the invention are described.

When a thin film integrated circuit in the wireless tag of the invention includes a memory such as a ROM in which data cannot be rewritten, it is possible to prevent forgery of bills, checks, family registers, resident cards, traveler's checks, passports and the like. Further, when the wireless tag is used for foods whose commercial value depends crucially on a production area, a producer and the like, the forgery of production area, producer and the like can be prevented at low cost.

Figure 13A:
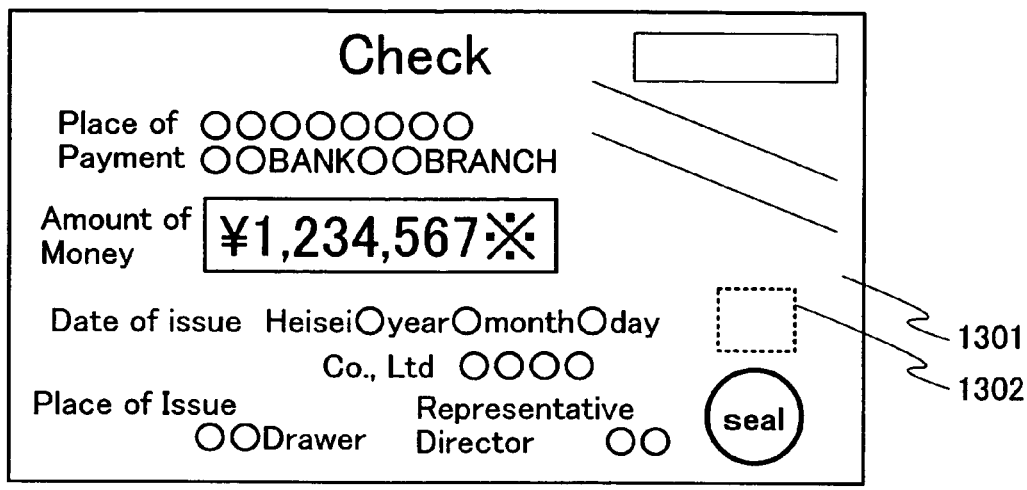
FIGS. 13A to 13C are views showing applications of the wireless tag of the invention.

FIG. 13A shows an example of a check 1301 including a wireless tag 1302 of the invention. In FIG. 13A, the wireless tag 1302 is put inside the check 1301, though it may be exposed outside the check 1301.

Figure 13B:
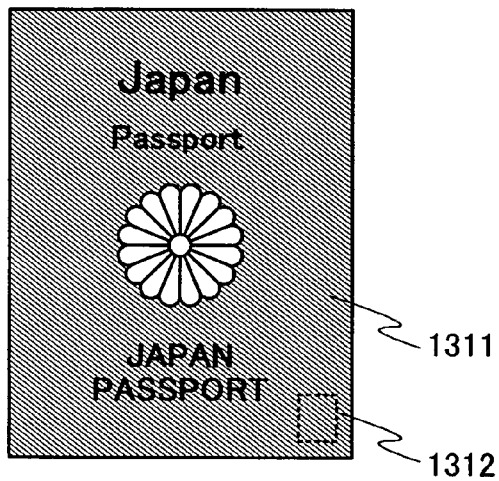

FIG. 13B shows an example of a passport 1311 including a wireless tag 1312 of the invention. In FIG. 13B, the wireless tag 1312 is put on a cover of the passport 1311, though it may be put on other pages of the passport 1311.

Figure 13C:
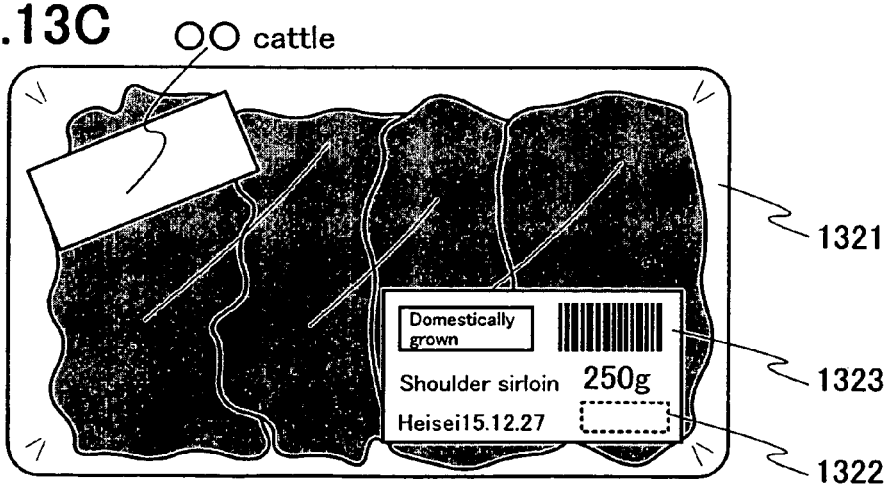

Since the wireless tag of the invention is inexpensive and small, it is effectively used as the disposable one that is thrown away by a consumer. In particular, the inexpensive and small wireless tag of the invention is quite effective for a product increase in the price of which by a few yens or a few tens of yens has an effect on sales. FIG. 13C shows a meat pack 1321 attached with a display label 1323 including a wireless tag 1322 of the invention. The wireless tag 1322 may be exposed on a surface of the display label 1323 or put inside the display label 1323. When the price of the product is written to the wireless tag 1322 as data, as compared with in the case of a conventional bar code being used, the product can be paid for even in the case of the distance between the product and a register being longer, and shoplifting can be prevented.

The form of the wireless tag of the invention can be changed to some extent in accordance with the form of an object attached with the wireless tag. In addition, the wireless tag of the invention can exhibit improved mechanical strength as compared with a wireless tag using an IC chip. Thus, the application range of the wireless tag of the invention is not limited to the one shown in this embodiment, and other various applications are possible.

This application is based on Japanese Patent Application serial No. 2003-414848 filed in Japan Patent Office on Dec. 12, 2003, and Japanese Patent Application serial No. 2004-009529 filed in Japan Patent Office on Jan. 16, 2004, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A semiconductor device comprising a thin film integrated circuit, an antenna, and a substrate, the substrate being flexible,
    wherein the thin film integrated circuit comprises a thin film transistor;
    wherein the antenna is formed over the substrate;
    wherein the thin film transistor is formed over a part of the antenna; and
    wherein the thin film integrated circuit is attached to the substrate by an anisotropic conductive resin at a first region overlapping a connecting terminal of the thin film integrated circuit and a connecting terminal of the antenna, and by an insulating resin at a second region overlapping the antenna.

2. The semiconductor device according to claim 1, wherein the antenna is formed by a droplet ejection method and formed of Ag, Au or Cu.

3. The semiconductor device according to claim 1, further comprising a metal oxide film over the thin film transistor.

4. The semiconductor device according to claim 3, further comprising a protective layer over the metal oxide film.

5. The semiconductor device according to claim 1, wherein the thin film transistor comprises a gate electrode and a semiconductor layer over the gate electrode.

6. The semiconductor device according to claim 1, wherein the thin film transistor comprises a semiconductor layer and a gate electrode over the semiconductor layer.

7. The semiconductor device according to claim 1, the adhesion bond is an anisotropic conductive resin.

8. A manufacturing method of a semiconductor device comprising a thin film integrated circuit and an antenna,
the thin film integrated circuit comprising a thin film transistor;
forming the antenna over a first substrate;
forming the thin film integrated circuit over a second substrate, and
peeling off the thin film integrated circuit from the second substrate by removing the second substrate;
wherein the thin film integrated circuit and the antenna are attached to each other so as to be electrically connected and have a stacked structure,
wherein the thin film integrated circuit is attached to the first substrate by an anisotropic conductive resin at a first region overlapping a connecting terminal of the thin film integrated circuit and a connecting terminal of the antenna, and by an insulating resin at a second region overlapping the antenna.

9. A semiconductor device comprising a thin film integrated circuit, an antenna, and a substrate,
wherein the thin film integrated circuit comprises a thin film transistor;
wherein the substrate is flexible and comprises a first portion, a second portion, and a third portion, the second portion provided between the first portion and the third portion;
wherein the antenna is formed over the first portion of the substrate;
wherein the thin film integrated circuit is attached to the first portion of the substrate so as to be electrically connected to the antenna; and
wherein the substrate is folded so that the thin film integrated circuit is interposed between the first portion and the third portion,
wherein the thin film integrated circuit is attached to the substrate by an anisotropic conductive resin at a first region overlapping a connecting terminal of the thin film integrated circuit and a connecting terminal of the antenna, and by an insulating resin at a second region overlapping the antenna.

10. The semiconductor device according to claim 9, the adhesion bond is an anisotropic conductive resin.

11. The semiconductor device according to claim 9, wherein the antenna is formed by a droplet ejection method and formed of Ag, Au or Cu.

12. A semiconductor device comprising a thin film integrated circuit, an antenna, and a substrate, the substrate being flexible,
wherein the substrate has four sides and three sides of the four sides are closed,
wherein the thin film integrated circuit comprises a thin film transistor;
wherein the antenna is formed in the substrate; and
wherein the thin film integrated circuit is attached inside the substrate by an anisotropic conductive resin at a first region overlapping a connecting terminal of the thin film integrated circuit and a connecting terminal of the antenna, and by an insulating resin at a second region overlapping the antenna.

13. A semiconductor device according to claim 12, wherein one side of the four sides is open.

14. The semiconductor device according to claim 12, the adhesion bond is an anisotropic conductive resin.

15. The semiconductor device according to claim 12, wherein the antenna is formed by a droplet ejection method and formed of Ag, Au or Cu.

16. A semiconductor device comprising a thin film integrated circuit, an antenna, a first substrate, and a second substrate, the first and second substrates being flexible,
wherein the thin film integrated circuit comprises a thin film transistor;
wherein the antenna is formed over the first substrate;
wherein the thin film transistor is formed over a part of the antenna;
wherein the thin film integrated circuit is attached to the first substrate so as to be electrically connected to the antenna;
wherein the second substrate is stacked over the first substrate so that the antenna and the thin film integrated circuit are interposed therebetween, and
wherein the thin film integrated circuit is attached to the first substrate by an anisotropic conductive resin at a first region overlapping a connecting terminal of the thin film integrated circuit and a connecting terminal of the antenna, and by an insulating resin at a second region overlapping the antenna.

17. The semiconductor device according to claim 16, wherein the second substrate is a protective layer,
wherein an oxide film and a metal oxide film are interposed between the thin film transistor and protective layer.

18. The semiconductor device according to claim 16, wherein the thin film integrated circuit is connected to the antenna via an anisotropic conductive resin.

19. The paper according to claim 18, wherein the antenna is formed by a droplet ejection method and formed of Ag, Au or Cu.

20. The semiconductor device according to claim 16, wherein the antenna is formed by a droplet ejection method and formed of Ag, Au or Cu.

21. A semiconductor device comprising a thin film integrated circuit, a first antenna, a second antenna, a first substrate, and a second substrate, the first and second substrates being flexible,
wherein the thin film integrated circuit comprises a thin film transistor;
wherein the first antenna is formed over the first substrate;
wherein the second antenna is formed over the second substrate;
wherein the thin film integrated circuit is attached to the first substrate so as to be electrically connected to the first antenna; and
wherein the second substrate is stacked over the first substrate so that the first antenna is electrically connected to the second antenna, and
wherein the second substrate is stacked over the first substrate so that the first antenna, the second antenna and the thin film integrated circuit are interposed between the first substrate and the second substrate.

22. The semiconductor device according to claim 21, wherein the first antenna or the second antenna is formed by a droplet ejection method and formed of Ag, Au or Cu.

23. The semiconductor device according to claim 21, the adhesion bond is an anisotropic conductive resin.

24. A semiconductor device comprising a thin film integrated circuit comprising a thin film transistor, wherein the thin film integrated circuit comprises a connecting terminal; and wherein the thin film integrated circuit comprises a rectification circuit for generating a DC power source voltage from an AC signal inputted to the connecting terminal by an antenna, a demodulation circuit for demodulating the AC signal to generate a first signal, a microprocessor for performing a processing in accordance with the first signal to generate a second signal, a modulation circuit for modulating the second signal, and a switch for modulating a load applied to the antenna in accordance with the modulated second signal, wherein the antenna is formed over the substrate;

wherein the thin film transistor is formed over a part of the antenna; and wherein the thin film integrated circuit is attached to the substrate so as to be electrically connected to the antenna.

25. A manufacturing method of a semiconductor device comprising a thin film integrated circuit comprising a thin film transistor, wherein the thin film integrated circuit comprises a connecting terminal;

wherein the thin film integrated circuit comprises a rectification circuit for generating a DC power source voltage from an AC signal inputted to the connecting terminal by an antenna, a demodulation circuit for demodulating the AC signal to generate a first signal, a microprocessor for performing a processing in accordance with the first signal to generate a second signal, a modulation circuit for modulating the second signal, and a switch for modulating a load applied to the antenna in accordance with the modulated second signal;

forming the thin film integrated circuit over a substrate, and peeling off the thin film integrated circuit from the substrate by removing the substrate.

26. A paper having a semiconductor device, wherein the semiconductor device comprises a thin film integrated circuit, an antenna, and a substrate, the substrate being flexible, wherein the thin film integrated circuit comprises a thin film transistor;

wherein the antenna is formed over the substrate;

wherein the thin film transistor is formed over a part of the antenna; and wherein the thin film Integrated circuit is attached to the substrate by an anisotropic conductive resin at a first region overlapping a connecting terminal of the thin film integrated circuit and a connecting terminal of the antenna, and by an insulating resin at a second region overlapping the antenna.

27. The semiconductor device according to claim 26, the adhesion bond is an anisotropic conductive resin.

* * * * *